US012598865B2

(12) United States Patent (10) Patent No.: US 12,598,865 B2

Lee et al. (45) Date of Patent: Apr. 7, 2026

(54) DISPLAY DEVICE INCLUDING ELECTRICALLY CONNECTED PAD ELECTRODES AND MANUFACTURING METHOD THEREOF

(71) Applicant: Samsung Display Co., Ltd., Yongin-si (KR)

(72) Inventors: Jaehyun Lee, Gwacheon-si (KR); Seul-Ki Kim, Incheon (KR); Kap Soo Yoon, Seoul (KR); Ki Su Jin, Cheonan-si (KR); Seung-Ha Choi, Hwaseong-si (KR); Jongbum Choi, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 739 days.

(21) Appl. No.: 17/874,702

(22) Filed: Jul. 27, 2022

(65) Prior Publication Data

US 2023/0128398 A1 Apr. 27, 2023

(30) Foreign Application Priority Data

Oct. 27, 2021 (KR) ........................ 10-2021-0144616

(51) Int. Cl.
*H10K 59/121* (2023.01)
*H10K 59/12* (2023.01)
*H10K 71/00* (2023.01)

(52) U.S. Cl.
CPC ......... *H10K 59/1213* (2023.02); *H10K 71/00* (2023.02); *H10K 59/1201* (2023.02)

(58) Field of Classification Search
CPC . H10K 59/1213; H10K 71/00; H10K 59/1201
USPC ......................................................... 257/40
See application file for complete search history.

(56) References Cited

U.S. PATENT DOCUMENTS

| | | | |
|---|---|---|---|
| 11,302,771 B2 | 4/2022 | Won et al. | |
| 2021/0020721 A1* | 1/2021 | Kwack ................. | H10K 59/122 |

FOREIGN PATENT DOCUMENTS

| KR | 10-1424249 | | | 8/2014 | | |
|---|---|---|---|---|---|---|
| KR | 10-2018-0077742 | | | 7/2018 | | |
| KR | 20180077742 | A | * | 7/2018 | ......... | H01L 27/1288 |
| KR | 20200026569 | A | * | 3/2020 | ......... | H01L 51/5237 |
| KR | 10-2021-0008768 | | | 1/2021 | | |
| KR | 10-2021-0012100 | | | 2/2021 | | |

* cited by examiner

*Primary Examiner* — Norman D Richards
*Assistant Examiner* — Colin Russell Mccutcheon
(74) *Attorney, Agent, or Firm* — Harness, Dickey & Pierce, P.L.C.

(57) ABSTRACT

A display device includes a pixel, a first pad electrode disposed around the pixel, a buffer layer disposed on the first pad electrode, a first insulating layer disposed on the buffer layer, and a second pad electrode disposed on the first insulating layer, the second pad electrode being electrically connected to the first pad electrode through a contact hole in the first insulating layer and the buffer layer. A first step, a second step below the first step, and a third step below the second step are defined on the first insulating layer and the buffer layer around the first pad electrode and the second pad electrode.

21 Claims, 32 Drawing Sheets

DISPLAY DEVICE INCLUDING ELECTRICALLY CONNECTED PAD ELECTRODES AND MANUFACTURING METHOD THEREOF

CROSS-REFERENCE TO RELATED APPLICATION(S)

This application claims priority to and benefits of Korean Patent Application No. 10-2021-0144616 under 35 U.S.C. § 119 filed on Oct. 27, 2021, in the Korean Intellectual Property Office, the entire contents of which are incorporated herein by reference.

BACKGROUND

1. Technical Field

Embodiments described herein relate to a display device and a manufacturing method thereof.

2. Description of the Related Art

Electronic devices, such as a smart phone, a digital camera, a notebook computer, a navigation system, a smart television, and the like, which provide an image to a user include a display device for displaying an image. The display device generates an image and provides the generated image to the user through a display screen.

In general, a display device may include pixels that display an image, lines connected to the pixels, and a driver connected to the lines. The driver provides drive signals to the pixels through the lines, and the pixels operate in response to the drive signals.

The lines may be connected to the driver through pads. For example, the lines and the pads may be disposed on a substrate, and the pads may be connected to the lines. The driver may be disposed on a flexible circuit board, and connecting pads connected to the driver may be disposed on the flexible circuit board. The pads may be connected to the connecting pads through a bonding process. The pads may be formed of layers through processes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including pads having a simplified configuration and improved contact with connecting pads, and a manufacturing method of the display device.

According to an embodiment, a display device may include a pixel; a first pad electrode disposed around the pixel; a buffer layer disposed on the first pad electrode; a first insulating layer disposed on the buffer layer; and a second pad electrode disposed on the first insulating layer, the second pad electrode being electrically connected to the first pad electrode through a contact hole in the first insulating layer and the buffer layer. A first step, a second step below the first step, and a third step below the second step are defined on the first insulating layer and the buffer layer around the first pad electrode and the second pad electrode.

The first step may be defined on the first insulating layer, the second step may be continuously defined on the buffer layer and the first insulating layer, and the third step may be defined on the buffer layer.

The second step may be disposed outward of the first step, and the third step may be disposed outward of the second step.

The first step may be defined by a first upper surface of the first insulating layer that contacts the second pad electrode, a first side surface of the first insulating layer that extends downward from an end of the first upper surface that overlaps an end of the second pad electrode in a plan view, and a second upper surface of the first insulating layer that extends outward from a lower end of the first side surface parallel to the first upper surface, the second step may be defined by the second upper surface, a second side surface of the first insulating layer that extends downward from an end of the second upper surface and disposed outward of the first side surface, a third side surface of the buffer layer disposed below the second side surface and formed to be a same side surface as the second side surface, and a third upper surface of the buffer layer that extends outward from a lower end of the third side surface parallel to the second upper surface, and the third step may be defined by the third upper surface, a fourth side surface of the buffer layer that extends downward from an end of the third upper surface and disposed outward of the third side surface, and a fourth upper surface of the buffer layer that extends outward from a lower end of the fourth side surface parallel to the third upper surface.

A lower surface of the first insulating layer below the first upper surface and a lower surface of the first insulating layer below the second upper surface may be coplanar, and the third step may be defined by a thickness of the first pad electrode.

The pixel may include a transistor including a gate electrode, a source electrode, and a drain electrode; a light emitting element disposed over the transistor and electrically connected to the drain electrode; a first conductive pattern and a second conductive pattern disposed below the transistor; a first connecting electrode electrically connected to the first conductive pattern and the source electrode; and a second connecting electrode electrically connected to the second conductive pattern, the drain electrode, and the light emitting element, the first connecting electrode, the second connecting electrode, and the gate electrode may be disposed on a same layer, the first pad electrode, the first conductive pattern, and the second conductive pattern may be disposed on a same layer, and the second pad electrode and a portion of the gate electrode may be disposed on a same layer.

The gate electrode, the first conductive pattern, the second conductive pattern, and the first pad electrode each may include a first electrode; and a second electrode disposed on the first electrode, the second pad electrode and the first electrode of the gate electrode may be disposed on same layer, and the second pad electrode and the first electrode of the gate electrode may contain a same material.

The second pad electrode and the first pad electrode may extend in a second direction intersecting a direction, and the second pad electrode may have a greater width than a width of the first pad electrode in the direction.

The first step may be continuously defined on the first insulating layer and the buffer layer, and the second step and the third step may be defined on the buffer layer.

The first step may be defined by a first upper surface of the first insulating layer that contacts the second pad electrode, a first side surface of the first insulating layer that extends downward from an end of the first upper surface that overlaps an end of the second pad electrode in a plan view, a second side surface of the buffer layer disposed below the first side surface and disposed on a same side surface as the first side surface of the first insulating layer, and a second upper surface of the buffer layer that extends outward from a lower end of the second side surface parallel to the first upper surface, the second step may be defined by the second upper surface, a third side surface of the buffer layer that extends downward from an end of the second upper surface and disposed outward of the second side surface, and a third upper surface of the buffer layer that extends outward from a lower end of the third side surface parallel to the second upper surface, and the third step may be defined by the third upper surface, a fourth side surface of the buffer layer that extends downward from an end of the third upper surface and disposed outward of the third side surface, and a fourth upper surface of the buffer layer that extends outward from a lower end of the fourth side surface parallel to the third upper surface.

The fourth upper surface may be disposed lower than an upper surface of the first pad electrode.

According to an embodiment, a method for manufacturing a display device may include providing a first pad electrode on a non-display area of a substrate, the substrate including a display area and the non-display area adjacent to the display area; providing a buffer layer and a first insulating layer on the first pad electrode in sequence; providing a dummy metal on the first insulating layer, the dummy metal being electrically connected to the first pad electrode through a contact hole in the first insulating layer and the buffer layer; providing a second insulating layer on the buffer layer to cover the dummy metal; removing a portion of the second insulating layer that overlaps the non-display area in a plan view; providing an anode over the display area; and removing a dummy electrode of the dummy metal disposed on a second pad electrode of the dummy metal. A first step, a second step, and a third step may be continuously defined in a downward direction on the first insulating layer and the buffer layer around the first pad electrode and the second pad electrode.

The first step may be defined on the first insulating layer, the second step may be continuously defined on the first insulating layer and the buffer layer, the third step may be defined on the buffer layer, and the first step and the second step may be formed in the removing of the portion of the second insulating layer.

A portion of the first insulating layer disposed around the dummy metal may be defined as an outer portion, and in case that the portion of the second insulating layer is removed, the outer portion is removed from an upper surface of the outer portion to a portion between the upper surface of the outer portion and a lower surface of the outer portion.

The method may further include providing a third insulating layer on the second insulating layer in the display area; and providing the anode on the third insulating layer.

The providing of the anode may include providing the anode on the third insulating layer and the dummy metal in the display area and the non-display area; removing a portion of the anode disposed on the non-display area; and performing ashing on the non-display area.

The first step may be continuously defined on the first insulating layer and the buffer layer, the second step and the third step may be defined on the buffer layer, and the first step and the second step may be formed in the performing of the ashing on the non-display area.

A portion of the first insulating layer disposed around the dummy metal may be defined as an outer portion, and in case that the portion of the second insulating layer is removed, the outer portion is removed.

The second pad electrode and the first pad electrode may extend in a direction, and the second pad electrode may have a greater width than a width of the first pad electrode in another direction intersecting the direction.

According to an embodiment, a method for manufacturing a display device may include providing a first pad electrode on a non-display area of a substrate, the substrate including a display area and the non-display area adjacent to the display area; providing a buffer layer and a first insulating layer on the first pad electrode in sequence; providing a dummy metal on the first insulating layer, the dummy metal may be electrically connected to the first pad electrode through a contact hole in the first insulating layer and the buffer layer; providing a second insulating layer over the substrate to cover the dummy metal; removing a portion of the second insulating layer that overlaps the non-display area in a plan view; defining a portion of the first insulating layer disposed around the dummy metal as an outer portion and removing the outer portion from an upper surface of the outer portion to a portion between the upper surface and a lower surface of the outer portion in case that the portion of the second insulating layer is removed; and removing a dummy electrode of the dummy metal disposed on a second pad electrode of the dummy metal. In the removing of the portion of the second insulating layer, a first step and a second step may be formed on a periphery of the first insulating layer around the second pad electrode.

BRIEF DESCRIPTION OF THE DRAWINGS

The above and other objects and features of the disclosure will become apparent by describing in detail embodiments thereof with reference to the accompanying drawings.

FIG. 8 is a schematic-cross sectional view illustrating of a portion of a display area and a portion of a non-display area of the display panel illustrated in FIG. 4.

FIGS. 10 to 18 are views for explaining a method of manufacturing the display device according to an embodiment.

FIG. 21 is a view illustrating a step structure around a pad according to an embodiment.

FIGS. 23 to 31 are views for explaining a method of manufacturing the display device according to an embodiment.

DETAILED DESCRIPTION OF THE EMBODIMENTS

Figure 1:
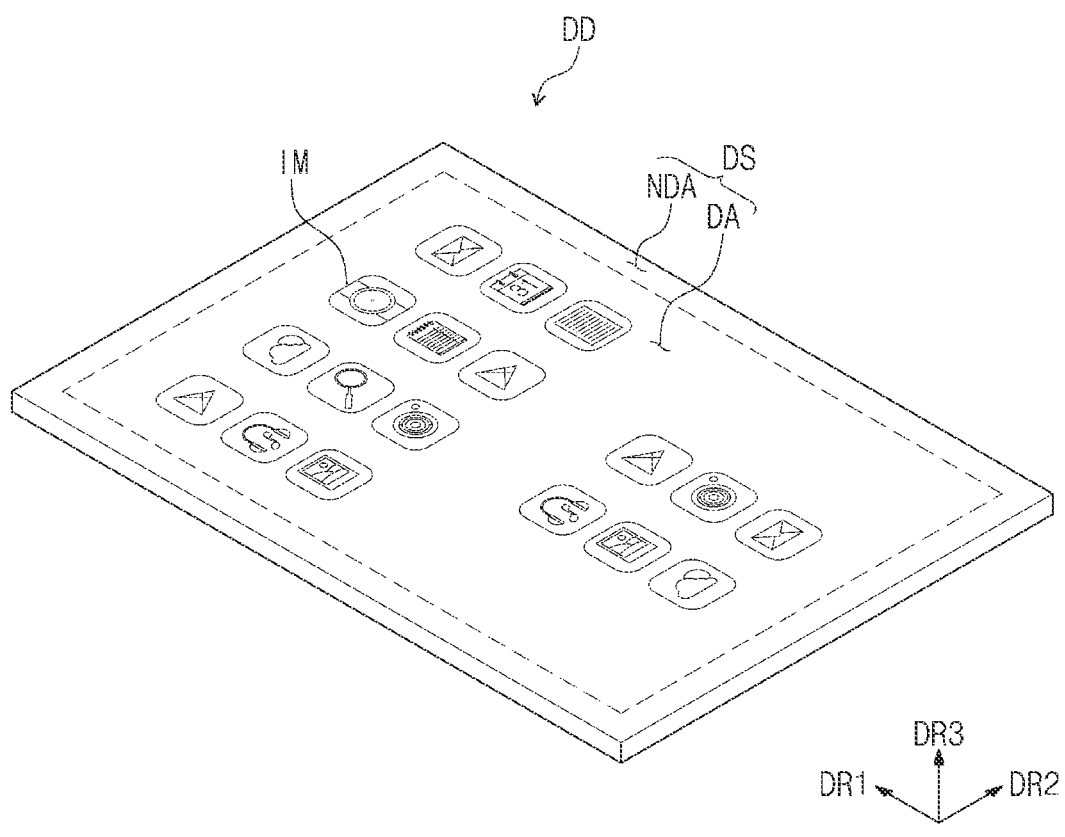
FIG. 1 is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, when it is mentioned that a component (or, an area, a layer, a part, etc.) is referred to as being "on", "connected to" or "coupled to" another component, this means that the component may be directly on, connected to, or coupled to the other component or a third component or other components may be present therebetween.

It will be understood that the terms "connected to" or "coupled to" may include a physical or electrical connection or coupling.

Identical reference numerals refer to identical components. In the drawings, the thicknesses, proportions, and dimensions of components may be exaggerated for effective description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms such as first, second, and the like may be used to describe various components, but the components should not be limited by the terms. The terms may be used only for distinguishing one component from other components. For example, without departing the scope of the disclosure, a first component may be referred to as a second component, and similarly, the second component may also be referred to as the first component. The terms of a singular form may include plural forms unless otherwise specified.

For example, as used herein, the singular forms, "a," "an," and "the" are intended to include the plural forms as well, unless the context clearly indicates otherwise.

Terms such as "below", "under", "above", and "over" are used to describe a relationship of components illustrated in the drawings. The terms are relative concepts and are described based on directions illustrated in the drawing but not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

It should be understood that terms such as "comprise", "include", and "have", and variations thereof when used herein, specify the presence of stated features, numbers, steps, operations, components, parts, or combinations thereof, but do not preclude the presence or addition of one or more other features, numbers, steps, operations, components, parts, or combinations thereof.

The phrase "in a plan view" means viewing the object from the top, and the phrase "in a schematic cross-sectional view" means viewing a cross-section of which the object is vertically cut from the side.

Hereinafter, embodiments will be described with reference to the accompanying drawings.

FIG. 1 is a schematic perspective view of a display device according to an embodiment.

Referring to FIG. 1, the display device DD according to an embodiment may have a rectangular shape with long sides extending in a first direction DR1 and short sides extending in a second direction DR2 intersecting the first direction DR1. However, without being limited thereto, the display device DD may have various shapes such as a circular shape, a polygonal shape, or the like within the spirit and the scope of the disclosure. It is to be understood that the shapes disclosed herein may also include shapes substantial to the shapes disclosed herein.

Hereinafter, a direction substantially vertically intersecting a plane defined by the first direction DR1 and the second direction DR2 is defined as a third direction DR3 As used herein, the expression "in a plan view" may mean that it is viewed in the third direction DR3.

An upper surface of the display device DD may be defined as a display surface DS and may have a plane defined by the first direction DR1 and the second direction DR2. Images IM generated by the display device DD may be provided to a user through the display surface DS.

The display surface DS may include a display area DA and a non-display area NDA around the display area DA. The display area DA may display an image, and the non-display area NDA may not display an image. The non-display area NDA may surround or may be adjacent to the display area DA and may define the border of the display device DD printed in a color.

The display device DD may be used in large electronic devices such as a television, a monitor, or outdoor signage. The display device DD may be used in small and medium-sized electronic devices such as a personal computer, a notebook computer, a personal digital terminal, a car navigation system, a game machine, a smart phone, a tablet computer, or a camera. However, these electronic devices are illustrative, and the display device DD may be used in other electronic devices without departing from the spirit and scope of the disclosure.

Figure 2:
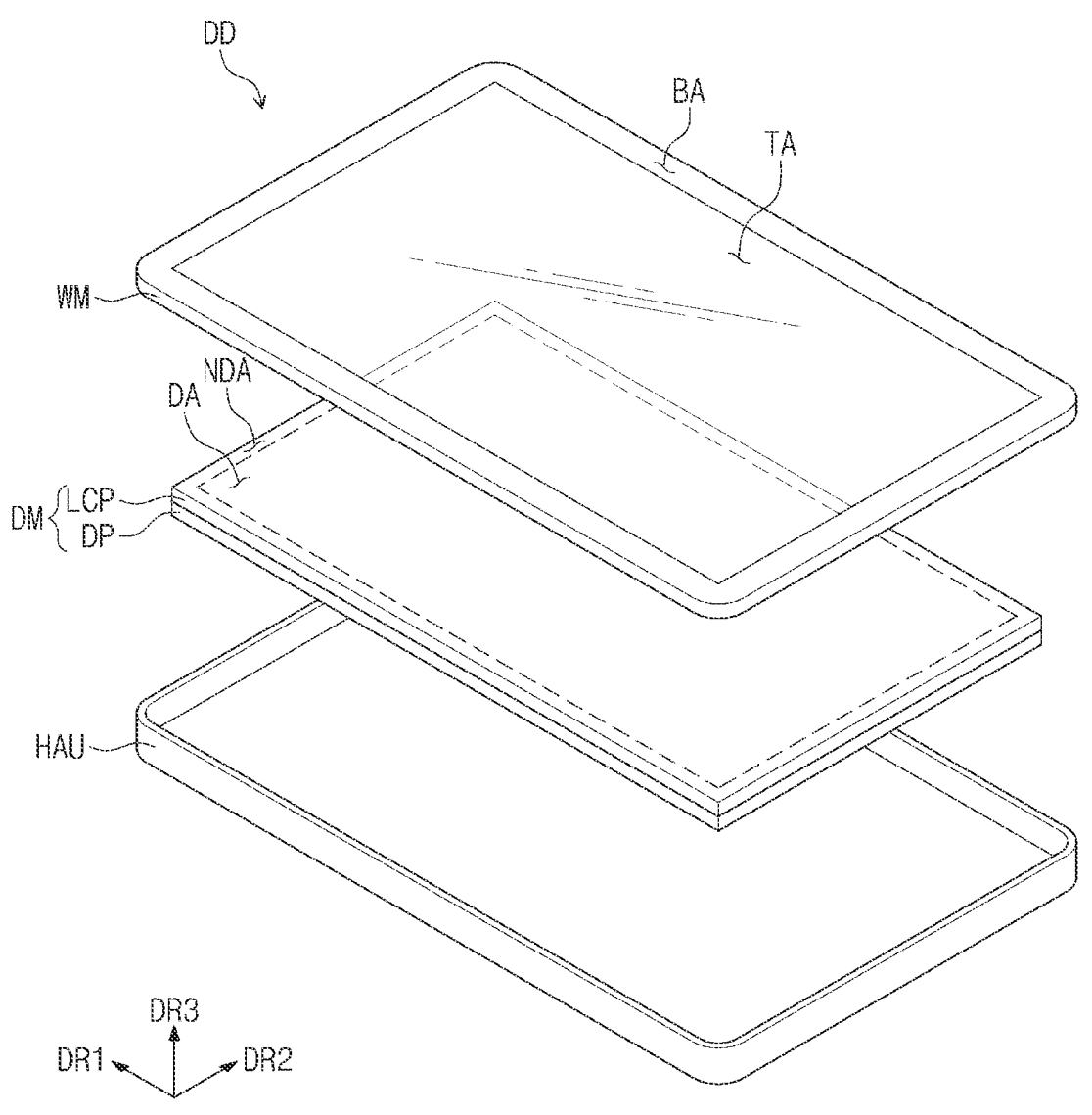
FIG. 2 is an exploded schematic perspective view of the display device illustrated in FIG. 1.

FIG. 2 is an exploded schematic perspective view of the display device illustrated in FIG. 1.

Referring to FIG. 2, the display device DD may include a window WM, a display module DM, and a case HAU. The window WM, the display module DM, and the case HAU may have a rectangular shape with long sides extending in the first direction DR1 and short sides extending in the second direction DR2 intersecting the first direction DR1.

The window WM may be disposed on the display module DM. The window WM may have a property of being optically transparent. For example, the window WM may contain glass or transparent plastic. The window WM may protect the display module DM from external shocks and scratches. The front surface of the window WM may correspond to the display surface DS of the display device DD described above.

The front surface of the window WM may include a transmissive area TA and a bezel area BA. The transmissive area TA may transmit light, and the bezel area BA may be printed in a color and may block light. The transmissive area TA may overlap the above-described display area DA, and the bezel area BA may overlap the above-described non-display area NDA.

The display module DM may be disposed between the window WM and the case HAU. The display module DM may include a display area DA and a non-display area NDA around the display area DA. The non-display area NDA may surround or may be adjacent to the display area DA. The display area DA may generate an image, and the non-display area NDA may not generate an image. The image generated by the display area DA may be provided to the user through the transmissive area TA.

The display module DM may include a display panel DP and a light conversion part LCP disposed on the display panel DP. Likewise to the display module DM, the display panel DP may include a display area DA and a non-display area NDA around the display area DA. The display area DA of the display panel DP may generate an image. The non-display area NDA may not be exposed to the outside by the bezel area BA.

In an embodiment, the display panel DP may be an emissive display panel and is not particularly limited thereto. For example, the display panel DP may be an organic light emitting display panel, an inorganic light emitting display panel, or a quantum dot light emitting display panel. An emissive layer of the organic light emitting display panel may contain an organic light emitting material, and an emissive layer of the inorganic light emitting display panel may contain an inorganic light emitting material. An emissive layer of the quantum dot light emitting display panel may contain quantum dots, quantum rods, and the like within the spirit and the scope of the disclosure. Hereinafter, the display panel DP as an organic light emitting display panel will be described.

The light conversion part LCP may receive light generated by the display panel DP and may convert the color of the received light. Furthermore, the light conversion part LCP may decrease the reflectance of external light. This configuration will be described below in detail.

The case HAU may be disposed under or below the display module DM and may accommodate the display module DM. The case HAU may absorb external shocks and may block external foreign matter and moisture to protect the display module DM.

The display device DD may further include an input sensing part (not illustrated) that is disposed between the display panel DP and the light conversion part LCP. The input sensing part may include sensing parts (not illustrated) for sensing an external input. The sensing parts may sense an external input in a capacitive manner.

The input sensing part may be manufactured on or directly manufactured on the display panel DP in manufacture of the display panel DP. However, without being limited thereto, the input sensing part may be manufactured as a panel separate from the display panel DP and may be attached to the display panel DP by an adhesive.

Figure 3:
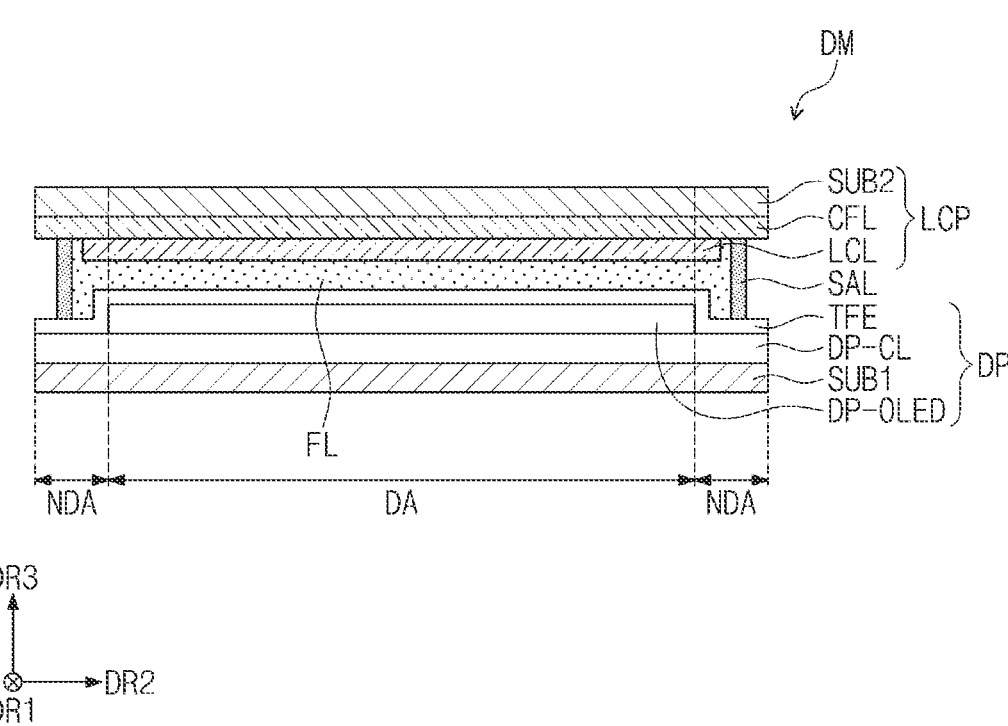
FIG. 3 is a schematic-cross sectional view of a display panel illustrated in FIG. 2.

FIG. 3 is a schematic-cross sectional view of the display panel illustrated in FIG. 2.

In FIG. 3, a section of the display panel DP viewed in the first direction DR1 is illustrated.

Referring to FIG. 3, the display module DM may include the display panel DP, the light conversion part LCP, a filler FL, and a sealant SAL. The light conversion part LCP may be disposed over the display panel DP, and the filler FL and the sealant SAL may be disposed between the light conversion part LCP and the display panel DP.

The sealant SAL may be disposed between the light conversion part LCP and the display panel DP to overlap the non-display area NDA. The light conversion part LCP and the display DP may be bonded to each other by the sealant SAL. The sealant SAL may include an ultraviolet (UV) curable material.

The filler FL may be disposed between the light conversion part LCP and the display panel DP to overlap the display area DA. The filler FL may extend toward the non-display area NDA and may make contact with the sealant SAL. The filler FL may include silicone, epoxy, and an acrylic-based thermosetting material.

The display panel DP may include a first substrate SUB1, a circuit element layer DP-CL, a display element layer DP-OLED, and a thin film encapsulation layer TFE. The light conversion part LCP may include a second substrate SUB2, a color filter layer CFL, and a light conversion layer LCL.

The second substrate SUB2 may be disposed over the first substrate SUB1 and may face the first substrate SUB1. The circuit element layer DP-CL, the display element layer DP-OLED, the thin film encapsulation layer TFE, the color filter layer CFL, the light conversion layer LCL, the filler FL, and the sealant SAL may be disposed between the first substrate SUB1 and the second substrate SUB2.

The first substrate SUB1 and the second substrate SUB2 may contain a flexible plastic material such as polyimide (PI) or glass. Likewise to the display panel DP, the first substrate SUB1 may include a display area DA and a non-display area NDA around the display area DA in a plan view.

The circuit element layer DP-CL may be disposed on the first substrate SUB1. The display element layer DP-OLED may be disposed on the circuit element layer DP-CL. The display element layer DP-OLED may be disposed on the display area DA.

Pixels may be disposed in the circuit element layer DP-CL and the display element layer DP-OLED. Each of the pixels may include a transistor disposed in the circuit element layer DP-CL and a light emitting element disposed in the display element layer DP-OLED and connected to the transistor. A configuration of the pixel will be described below in detail.

The thin film encapsulation layer TFE may be disposed on the circuit element layer DP-CL to cover or overlap the display element layer DP-OLED. The thin film encapsulation layer TFE may protect the pixels from moisture, oxygen, and external foreign matter.

The color filter layer CFL may be disposed under or below the second substrate SUB2. The color filter layer CFL may overlap the display area DA in a plan view. A portion of the color filter layer CFL may overlap the non-display area NDA.

The light conversion layer LCL may be disposed under or below the color filter layer CFL. The light conversion layer LCL may overlap the display area DA in a plan view. A portion of the light conversion layer LCL may overlap the non-display area NDA.

The sealant SAL may be disposed between the first substrate SUB1 and the second substrate SUB2 to overlap the non-display area NDA. The first substrate SUB1 and the second substrate SUB2 may be bonded to each other by the sealant SAL. The sealant SAL may be disposed between the thin film encapsulation layer TFE and the color filter layer CFL. The sealant SAL may surround the light conversion layer LCL. The filler FL may be disposed between the light conversion layer LCL and the thin film encapsulation layer TFE to overlap the display area DA.

Light generated from the display element layer DP-OLED may be provided to the light conversion layer LCL. The light conversion layer LCL may convert the color of the light provided from the display element layer DP-OLED. The color-converted light may be output to the outside through the color filter layer CFL and the second substrate SUB2.

The color filter layer CFL may prevent reflection of external light provided to the display panel DP from the outside. The function of the color filter layer CFL will be described below in detail.

Figure 4:
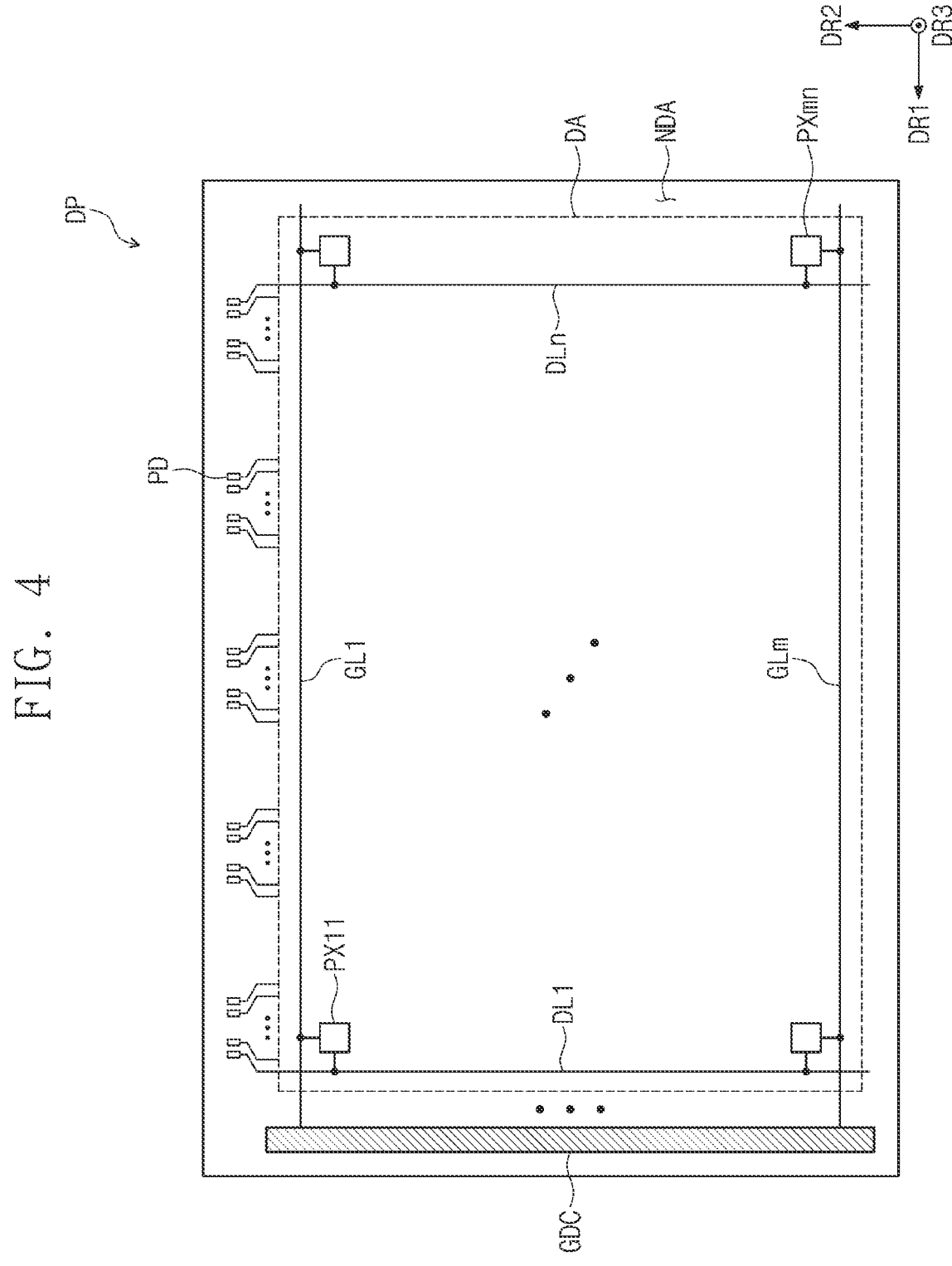
FIG. 4 is a schematic plan view of the display panel illustrated in FIG. 3.

FIG. 4 is a schematic plan view of the display panel illustrated in FIG. 3.

Referring to FIG. 4, the display panel DP may have a rectangular shape with long sides extending in the first direction DR1 and short sides extending in the second direction DR2. The planar area of the display panel DP may include a display area DA and a non-display area NDA surrounding (or adjacent to) the display area DA.

The display panel DP may include pixels PX11 to PXmn, signal lines GL1 to GLm and DL1 to DLn, a gate driver circuit GDC, and pads PD. "m" and "n" are natural numbers. The signal lines GL1 to GLm and DL1 to DLn may include the gate lines GL1 to GLm and the data lines DL1 to DLn.

The pixels PX11 to PXmn may be arranged (or disposed) in a matrix form and may be disposed in the display area DA. The pixels PX11 to PXmn may be connected to the gate lines GL1 to GLm and the data lines DL1 to DLn.

The gate driver circuit GDC may be disposed in the non-display area NDA adjacent to one of the short sides of the display panel DP. The gate driver circuit GDC may be connected to the gate lines GL1 to GLm. The gate driver circuit GDC may be integrated on the display panel DP through an oxide silicon gate driver circuit (OSG) or amorphous silicon gate driver circuit (ASG) process.

The pads PD may be disposed in the non-display area NDA adjacent to one of the long sides of the display panel DP. The pads PD may be connected to the data lines DL1 to DLn.

Although not illustrated, a data driver may be connected to the pads PD. The data driver may be manufactured in the form of an integrated circuit chip and may be connected to the pads PD. The data driver may be mounted on a flexible circuit board (not illustrated) and may be connected to the pads PD through the flexible circuit board. The data driver may be connected to connecting pads (not illustrated) that are disposed on the flexible circuit board, and the connecting pads may be connected to the pads PD.

The gate lines GL1 to GLm may extend in the first direction DR1 and may be connected to the pixels PX11 to PXmn and the gate driver circuit GDC. The data lines DL1 to DLn may extend in the second direction DR2 and may be connected to the pixels PX11 to PXmn and the pads PD.

The gate driver circuit GDC may generate scan signals, and the scan signals may be applied to the pixels PX11 to PXmn through the gate lines GL1 to GLm. The data driver may generate data voltages, and the data voltages may be applied to the pixels PX11 to PXmn through the data lines DL1 to DLn.

The pixels PX11 to PXmn may receive the data voltages in response to the scan signals. The pixels PX11 to PXmn may display an image by emitting light having luminance corresponding to the data voltages.

Figure 5:
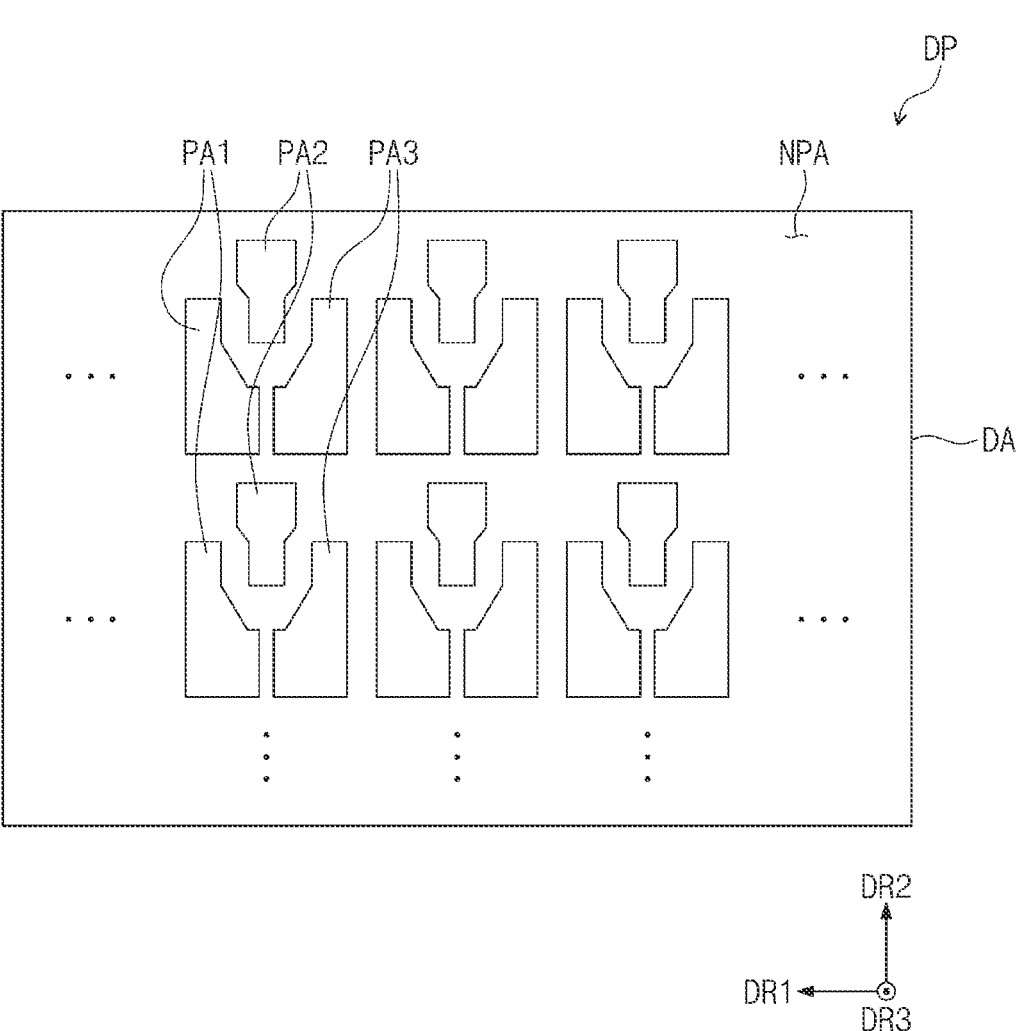
FIG. 5 is an enlarged schematic plan view of a portion of a display area illustrated in FIG. 4.

FIG. 5 is an enlarged schematic plan view of a portion of the display area illustrated in FIG. 4.

Referring to FIG. 5, the display area DA may include first emissive areas PA1, second emissive areas PA2, third emissive areas PA3, and a non-emissive area NPA disposed around each of the first, second, and third emissive areas PA1, PA2, and PA3. The first, second, and third emissive areas PA1, PA2, and PA3 may correspond to the pixels PX11 to PXmn.

The first and third emissive areas PA1 and PA3 may have a same polygonal shape in a plan view. The first emissive area PA1 may have a shape symmetric to the shape of the third emissive area PA3 with respect to a virtual axis extending in the second direction DR2. The second emissive area PA2 may have a different polygonal shape from the first and third emissive areas PA1 and PA3.

The first emissive areas PA1 and the third emissive areas PA3 may be arranged (or disposed) in the first direction DR1 and the second direction DR2. The first emissive areas PA1 and the third emissive areas PA3 may be alternately arranged (or disposed) in the first direction DR1. The second emissive areas PA2 may be arranged (or disposed) between the first emissive areas PA1 and the third emissive areas PA3 in the first direction DR1 and the second direction DR2.

The shapes and the area arrangement of the emissive areas PA1, PA2, and PA3 may be designed in various ways according to the light emission efficiency of light depending on colors and are not limited to the embodiment illustrated in FIG. 5.

Figure 6:
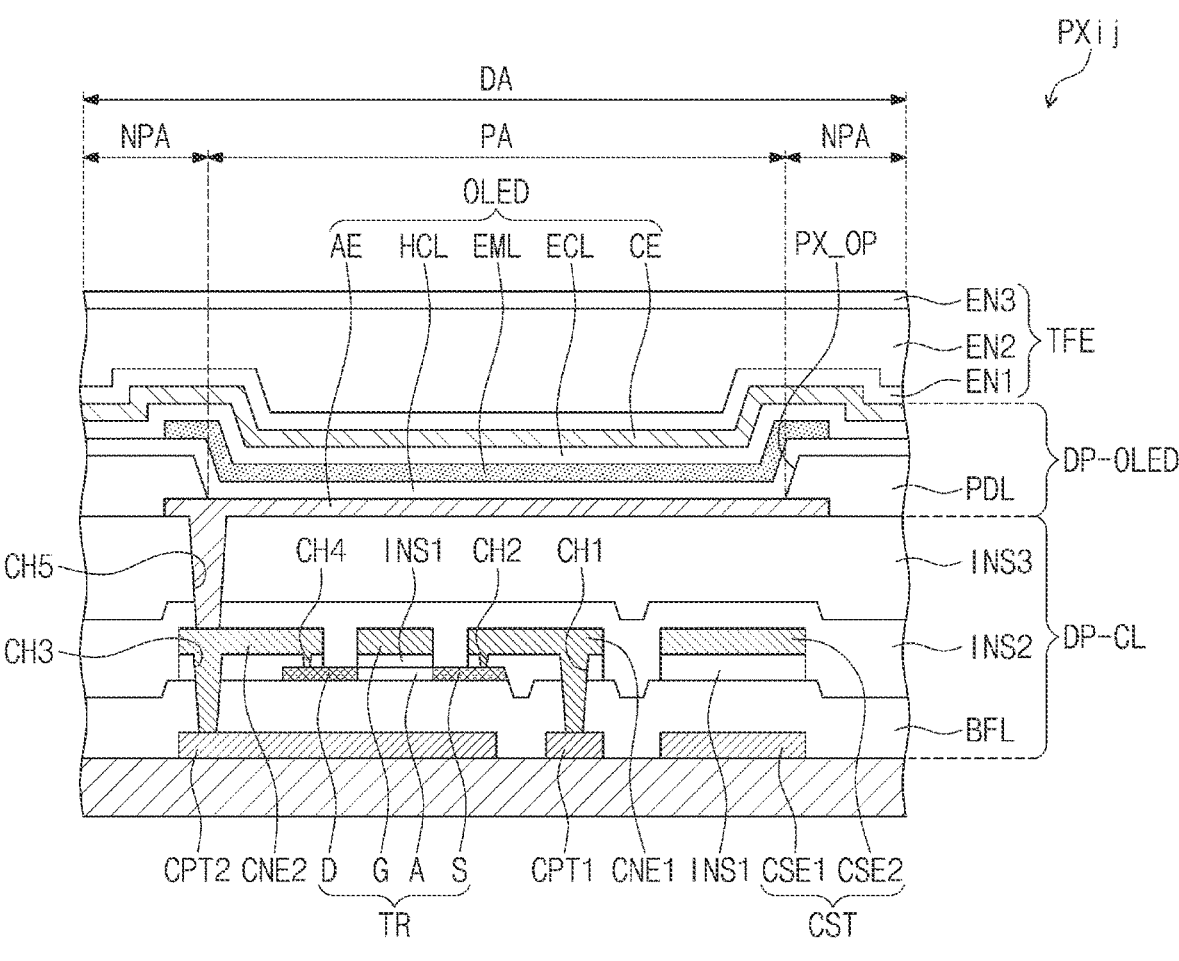
FIG. 6 is a schematic-cross sectional view of any one pixel illustrated in FIG. 4.

FIG. 6 is a schematic-cross sectional view of any one pixel illustrated in FIG. 4.

Referring to FIG. 6, a pixel PXij may include a transistor TR, a light emitting element OLED, a capacitor CST, a first conductive pattern CPT1, and a second conductive pattern CPT2. "i" and "j" are natural numbers. The transistor TR, the light emitting element OLED, the capacitor CST, and the first and second conductive patterns CPT1 and CPT2 may be disposed on the first substrate SUB1.

Although one transistor TR is illustrated, the pixel PXij may substantially include transistors for driving the light emitting element OLED.

The light emitting element OLED may include a first electrode AE, a second electrode CE, a hole control layer HCL, an electron control layer ECL, and an emissive layer EML. The first electrode AE may be defined as an anode, and the second electrode CE may be defined as a cathode. The emissive layer EML may be disposed between the first electrode AE and the second electrode CE.

The capacitor CST may include a first electrode CSE1 and a second electrode CSE2 disposed over the first electrode CSE1. The first electrode CSE1 and the second electrode CSE2 may be insulated from each other.

The display area DA may include an emissive area PA corresponding to the pixel PXij and a non-emissive area NPA around the emissive area PA. The light emitting element OLED may be disposed in the emissive area PA. The emissive area PA may be one of the first, second, and third emissive areas PA1, PA2, and PA3 described above.

The first and second conductive patterns CPT1 and CPT2 and the first electrode CSE1 may be disposed on the first substrate SUB1. The first conductive pattern CPT1, the second conductive pattern CPT2, and the first electrode CSE1 may be spaced apart from one another. The first conductive pattern CPT1 may be disposed between the second conductive pattern CPT2 and the first electrode CSE1. The first and second conductive patterns CPT1 and CPT2 may be disposed under or below the transistor TR.

The first and second conductive patterns CPT1 and CPT2 and the first electrode CSE1 may be formed on the first substrate SUB1 by being simultaneously subjected to patterning with a same material or a similar material. The first and second conductive patterns CPT1 and CPT2 and the first electrode CSE1 may contain metal.

A buffer layer BFL may be disposed on the first and second conductive patterns CPT1 and CPT2 and the first electrode CSE1. The buffer layer BFL may be disposed on the first substrate SUB1 to cover or overlap the first and second conductive patterns CPT1 and CPT2 and the first electrode CSE1. The buffer layer BFL may include an inorganic layer.

A semiconductor pattern D, A, and S may be disposed on the buffer layer BFL. The semiconductor pattern D, A, and S may contain poly silicon, amorphous silicon, or metal oxide. The semiconductor pattern D, A, and S may be disposed over the second conductive pattern CTP2.

The semiconductor pattern D, A, and S may be doped with an N-type dopant or a P-type dopant. The semiconductor pattern D, A, and S may include a heavily doped area and a lightly doped area. The conductivity of the heavily doped area may be higher than the conductivity of the lightly doped area, and the heavily doped area may substantially serve as the source electrode S and the drain electrode D of the transistor TR. The lightly doped area may substantially correspond to an active (or, channel) area A of the transistor TR. The source electrode S, the active area A, and the drain electrode D of the transistor TR may be formed from the semiconductor pattern D, A, and S.

A first insulating layer INS1 may be disposed on the semiconductor pattern D, A, and S and the buffer layer BFL. The first insulating layer INS1 may include an inorganic layer. The first insulating layer INS1 may be patterned in a shape and may be disposed to overlap a gate electrode G, first and second connecting electrodes CNE1 and CNE2, and the second electrode CSE2 that will be described below.

The gate electrode G, the first and second connecting electrodes CNE1 and CNE2, and the second electrode CSE2 may be disposed on the first insulating layer INS1. The gate electrode G, the first and second connecting electrodes CNE1 and CNE2, and the second electrode CSE2 may be spaced apart from one another.

The gate electrode G, the first and second connecting electrodes CNE1 and CNE2, and the second electrode CSE2 may be formed over the first substrate SUB1 by being simultaneously subjected to patterning with a same material or a similar material. The gate electrode G, the first and second connecting electrodes CNE1 and CNE2, and the second electrode CSE2 may contain a same material or a similar material as the first and second conductive patterns CPT1 and CPT2 and the first electrode CSE1. The gate electrode G, the first and second connecting electrodes CNE1 and CNE2, and the second electrode CSE2 may contain metal.

The first insulating layer INS1, in a plan view, may be disposed to overlap the gate electrode G, the first and second connecting electrodes CNE1 and CNE2, and the second electrode CSE2. As an example, the first insulating layer INS1 may be divided into first insulating layers INS1, and the first insulating layers INS1 may be disposed to overlap the gate electrode G, the first and second connecting electrodes CNE1 and CNE2, and the second electrode CSE2, respectively. The first insulating layer INS1, in a plan view, may not be disposed around the gate electrode G, the first and second connecting electrodes CNE1 and CNE2, and the second electrode CSE2.

The peripheries of the first insulating layers INS1, in a plan view, may protrude outward from the peripheries of the gate electrode G, the first and second connecting electrodes CNE1 and CNE2, and the second electrode CSE2.

The first connecting electrode CNE1 may be connected to the first conductive pattern CPT1 through a first contact hole CH1 defined in the first insulating layer INS1 and the buffer layer BFL. The first connecting electrode CNE1 may be connected to the source electrode S through a second contact hole CH2 defined in the first insulating layer INS1. Although not illustrated, the first connecting electrode CNE1 may be connected to a power line that supplies power to be provided to the light emitting element OLED. A first voltage may be provided to the transistor TR through the power line.

The second connecting electrode CNE2 may be connected to the second conductive pattern CPT2 through a third contact hole CH3 defined in the first insulating layer INS1 and the buffer layer BFL. The second connecting electrode CNE2 may be connected to the drain electrode D through a fourth contact hole CH4 defined in the first insulating layer INS1. The drain electrode D itself, which is a semiconductor, may not have high current transmission characteristics. In case that the second conductive pattern CPT2 containing metal is connected to the drain electrode D, current transmission characteristics through the drain electrode D may be improved.

A second insulating layer INS2 may be disposed on the gate electrode G, the first and second connecting electrodes CNE1 and CNE2, and the second electrode CSE2. The second insulating layer INS2 may include an inorganic layer.

The second insulating layer INS2 may be disposed on the buffer layer BFL to cover or overlap the gate electrode G, the first and second connecting electrodes CNE1 and CNE2, and the second electrode CSE2.

A third insulating layer INS3 may be disposed on the second insulating layer INS2. The third insulating layer INS3 may include an organic layer. The third insulating layer INS3 may provide a flat upper surface. The buffer layer BFL, the second insulating layer INS2, and the third insulating layer INS3, in which the transistor TR and the capacitor CST are disposed, may be defined as the circuit element layer DP-CL.

The first electrode AE may be disposed on the third insulating layer INS3. The first electrode AE may be connected to the second connecting electrode CNE2 through a fifth contact hole CH5 defined in the third insulating layer INS3 and the second insulating layer INS2. As the first electrode AE is connected to the second connecting electrode CNE2, the drain electrode D may be connected to the light emitting element OLED through the second connecting electrode CNE2. Furthermore, the second connecting electrode CNE2 may be connected to the light emitting element OLED through the first electrode AE.

A pixel defining film PDL having a pixel opening PX_OP defined therein for exposing a portion of the first electrode AE may be disposed on the first electrode AE and the third insulating layer INS3.

The hole control layer HCL may be disposed on the first electrode AE and the pixel defining film PDL. Although not illustrated, the hole control layer HCL may include a hole transporting layer and a hole injection layer.

The emissive layer EML may be disposed on the hole control layer HCL. The emissive layer EML may be disposed in the pixel opening PX_OP. The emissive layer EML may contain an organic material and/or an inorganic material. The emissive layer EML may generate blue light.

The electron control layer ECL may be disposed on the emissive layer EML and the hole control layer HCL. Although not illustrated, the electron control layer ECL may include an electron transporting layer and an electron injection layer. The hole control layer HCL and the electron control layer ECL may be commonly disposed in the emissive area PA and the non-emissive area NPA.

The second electrode CE may be disposed on the electron control layer ECL. The second electrode CE may be commonly disposed on the pixels PX11 to PXmn. The layer having the light emitting element OLED disposed therein may be defined as the display element layer DP-OLED.

The thin film encapsulation layer TFE may be disposed on the second electrode CE and may cover or overlap the pixel PXij. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2. The first and third encapsulation layers EN1 and EN3 may include inorganic layers, and the second encapsulation layer EN2 may include inorganic layers.

The first and third encapsulation layers EN1 and EN3 may protect the pixel PXij from moisture and/or oxygen. The second encapsulation layer EN2 may protect the pixel PXij from foreign matter such as dust particles.

A first voltage may be applied to the first electrode AE through the transistor TR, and a second voltage having a lower level than the first voltage may be applied to the second electrode CE. Holes and electrons injected into the emissive layer EML may be combined to form excitons, and the light emitting element OLED may emit light as the excitons transition to a ground state.

Figure 7:
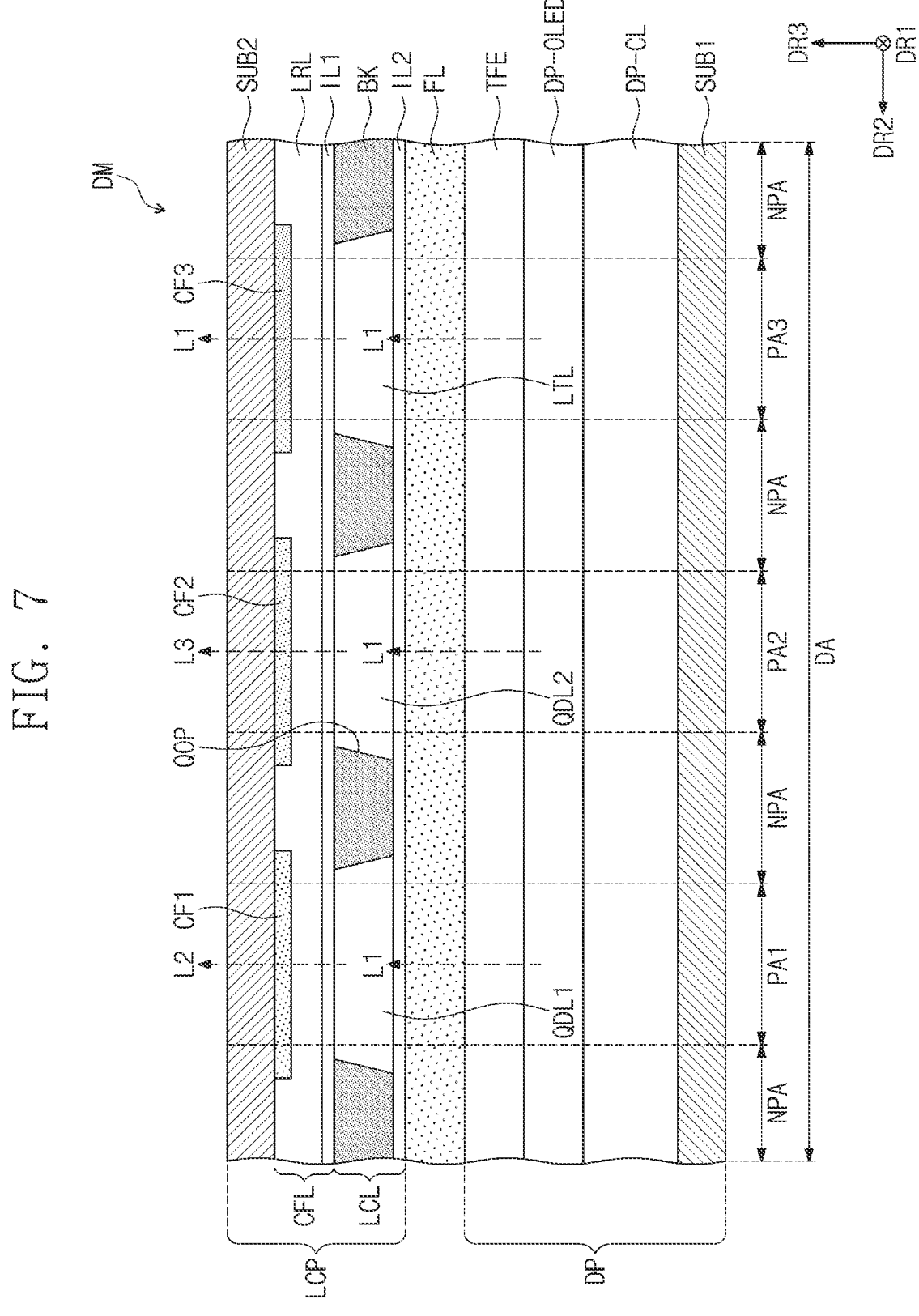
FIG. 7 is a schematic-cross sectional view illustrating a color filter layer and a light conversion layer corresponding to first, second, and third emissive areas in FIGS. 3 and 5.

FIG. 7 is a schematic-cross sectional view illustrating the color filter layer and the light conversion layer corresponding to the first, second, and third emissive areas in FIGS. 3 and 5.

In FIG. 7, the circuit element layer DP-CL, the display element layer DP-OLED, the thin film encapsulation layer TFE, and the filler FL are illustrated together with the color filter layer CFL and the light conversion layer LCL. Furthermore, the circuit element layer DP-CL, the display element layer DP-OLED, and the thin film encapsulation layer TFE are illustrated as a single layer in FIG. 7.

Referring to FIG. 7, the display area DA may include the first emissive area PA1, the second emissive area PA2, the third emissive area PA3, and the non-emissive area NPA disposed around each of the first, second, and third emissive areas PA1, PA2, and PA3. The first, second, and third emissive areas PA1, PA2, and PA3 may generate first light L1. For example, the first light L1 may be blue light.

The color filter layer CFL may include a first color filter CF1, a second color filter CF2, a third color filter CF3, a low refractive layer LRL, and a first insulating layer IL1. Although one first color filter CF1, one second color filter CF2, and one third color filter CF3 are illustrated, first color filters CF1, second color filters CF2, and third color filters CR3 may be provided.

The light conversion layer LCL may include a first quantum dot layer QDL1, a second quantum dot layer QDL2, a light transmitting layer LTL, a bank layer BK, and a second insulating layer IL2. Although one first quantum dot layer QDL1, one second quantum dot layer QDL2, and one light transmitting layer LTL are illustrated, first quantum dot layers QDL1, second quantum dot layers QDL2, and light transmitting layers LTL may be provided.

The first color filter CF1, the second color filter CF2, and the third color filter CF3 may be disposed under or below the second substrate SUB2. In a plan view, the first color filter CF1 may overlap the first emissive area PA1, the second color filter CF2 may overlap the second emissive area PA2, and the third color filter CF3 may overlap the third emissive area PA3. The first color filter CF1 may include a red color filter. The second color filter CF2 may include a green color filter. The third color filter CF3 may include a blue color filter.

The low refractive layer LRL may be disposed under or below the second substrate SUB2 to cover or overlap the first, second, and third color filters CF1, CF2, and CF3. The low refractive layer LRL may have a smaller refractive index than the first quantum dot layer QDL1, the second quantum dot layer QDL2, and the light transmitting layer LTL. The low refractive layer LRL may include an organic layer and scattering particles disposed in the organic layer to scatter light. The first insulating layer IL1 may be disposed under or below the low refractive layer LRL. The first insulating layer IL1 may include an inorganic layer.

The bank layer BK may be disposed under or below the first insulating layer IL1. The bank layer BK may overlap the non-emissive area NPA in a plan view. Openings QOP overlapping the first, second, and third emissive areas PA1, PA2, and PA3 may be defined in the bank layer BK. The openings QOP may have a greater width than the pixel opening PX_OP described above. The bank layer BK may be black in color.

The first and second quantum dot layers QDL1 and QDL2 and the light transmitting layer LTL may be disposed in the openings QOP. Accordingly, the first and second quantum dot layers QDL1 and QDL2 and the light transmitting layer LTL may overlap the first, second, and third emissive areas PA1, PA2, and PA3, respectively, in a plan view. The first quantum dot layer QDL1 may overlap the first emissive area PA1, the second quantum dot layer QDL2 may overlap the second emissive area PA2, and the light transmitting layer LTL may overlap the third emissive area PA3.

The second insulating layer IL2 may be disposed under or below the bank layer BK, the first and second quantum dot layers QDL1 and QDL2, and the light transmitting layer LTL. The second insulating layer IL2 may include an inorganic layer.

The first light L1 generated from the first, second, and third emissive areas PA1, PA2, and PA3 may be provided to the first and second quantum dot layers QDL1 and QDL2 and the light transmitting layer LTL. The first light L1 generated from the first emissive area PA1 may be provided to the first quantum dot layer QDL1, and the first light L1 generated from the second emissive area PA2 may be provided to the second quantum dot layer QDL2. The first light L1 generated from the third emissive area PA3 may be provided to the light transmitting layer LTL.

The first quantum dot layer QDL1 may convert the first light L1 into second light L2. The second quantum dot layer QDL2 may convert the first light L1 into third light L3. For example, the second light L2 may be red light, and the third light L3 may be green light. The first quantum dot layer QDL1 may include first quantum dots (not illustrated), and the second quantum dot layer QDL2 may include second quantum dots (not illustrated). The light transmitting layer LTL may include light scattering particles (not illustrated).

The first quantum dots may convert the first light L1 having a blue wavelength band into the second light L2 having a red wavelength band. The second quantum dots may convert the first light L1 having a blue wavelength band into the third light L3 having a green wavelength band. The first quantum dots and the second quantum dots may scatter the second light L2 and the third light L3.

The light transmitting layer LTL may transmit the first light L1 without performing a light conversion operation. The first light L1 may be output after scattered by the light scattering particles of the light transmitting layer LTL. The light scattering particles may be included in the first and second quantum dot layers QDL1 and QDL2.

The first quantum dot layer QDL1 may output the second light L2, the second quantum dot layer QDL2 may output the third light L3, and the light transmitting layer LTL may output the first light L1. Accordingly, an image may be displayed by the second light L2, the third light L3, and the first light L1 that display red, green, and blue colors.

The first light L1, the second light L2, and the third light L3 output from the light conversion layer LCL may be provided to the user through the low refractive layer LRL, the first, second, and third color filters CF1, CF2, and CF3, and the second substrate SUB2. The first light L1, the second light L2, and the third light L3 may be refracted in the low refractive layer LRL and may be output after further scattered by the scattering particles disposed in the low refractive layer LRL.

A portion of the first light L1 may be provided to the first color filter CF1 through the first quantum dot layer QDL1 without being light-converted by the first quantum dots. For example, the first light L1 that is not converted into the second light L2 because it is not brought into contact with the first quantum dots may exist. The first color filter CF1 may block light having a different color. The first light L1 not converted in the first quantum dot layer QDL1 may be blocked by the first color filter CF1 having a red color filter and may not be output upward.

A portion of the first light L1 may be provided to the second color filter CF2 through the second quantum dot layer QDL2 without being light-converted by the second quantum dots. For example, the first light L1 that is not converted into the third light L3 because it is not brought into contact with the second quantum dots may exist. The second color filter CF2 may block light having a different color. The first light L1 not converted in the second quantum dot layer QDL2 may be blocked by the second color filter CF2 having a green color filter and may not be output upward.

External light may be provided toward the display panel DP from above the display device DD. The external light may be white light. The white light may include red light, green light, and blue light. If the first, second, and third color filters CF1, CF2, and CF3 are not used, the external light may be provided to the user as it is after reflected by metal layers (for example, lines) inside the display panel DP. The external light may be visible to the user like light reflected from a mirror.

The first, second, and third color filters CF1, CF2, and CF3 may prevent reflection of the external light. The first, second, and third color filters CF1, CF2, and CF3 may filter the external light into red light, green light, and blue light.

As an example, green light and blue light of the external light provided to the first color filter CF1 may be blocked by the first color filter CF1 including a red color filter. Accordingly, the external light provided to the first color filter CF1 may be filtered into red light, which is the same as light output from the first quantum dot layer QDL1, by the first color filter CF1.

Red light and blue light of the external light provided to the second color filter CF2 may be blocked by the second color filter CF2 that is a green color filter. Accordingly, the external light provided to the second color filter CF2 may be filtered into green light, which is the same as light output from the second quantum dot layer QDL2, by the second color filter CF2.

Red light and green light of the external light provided to the third color filter CF3 may be blocked by the third color filter CF3 that is a blue color filter. Accordingly, the external light provided to the third color filter CF3 may be filtered into blue light, which is the same as light output from the light transmitting layer LTL, by the third color filter CF3. Thus, the external light may be blocked by the first, second, and third color filters CF1, CF2, and CF3, and reflection of the external light may be decreased.

The bank layer BK that is black in color may block unnecessary light in the non-emissive layer NPA. For example, the bank layer BK may prevent color mixing between the first light L1, the second light L2, and the third light L3 in the non-emissive area NPA.

Figure 8:
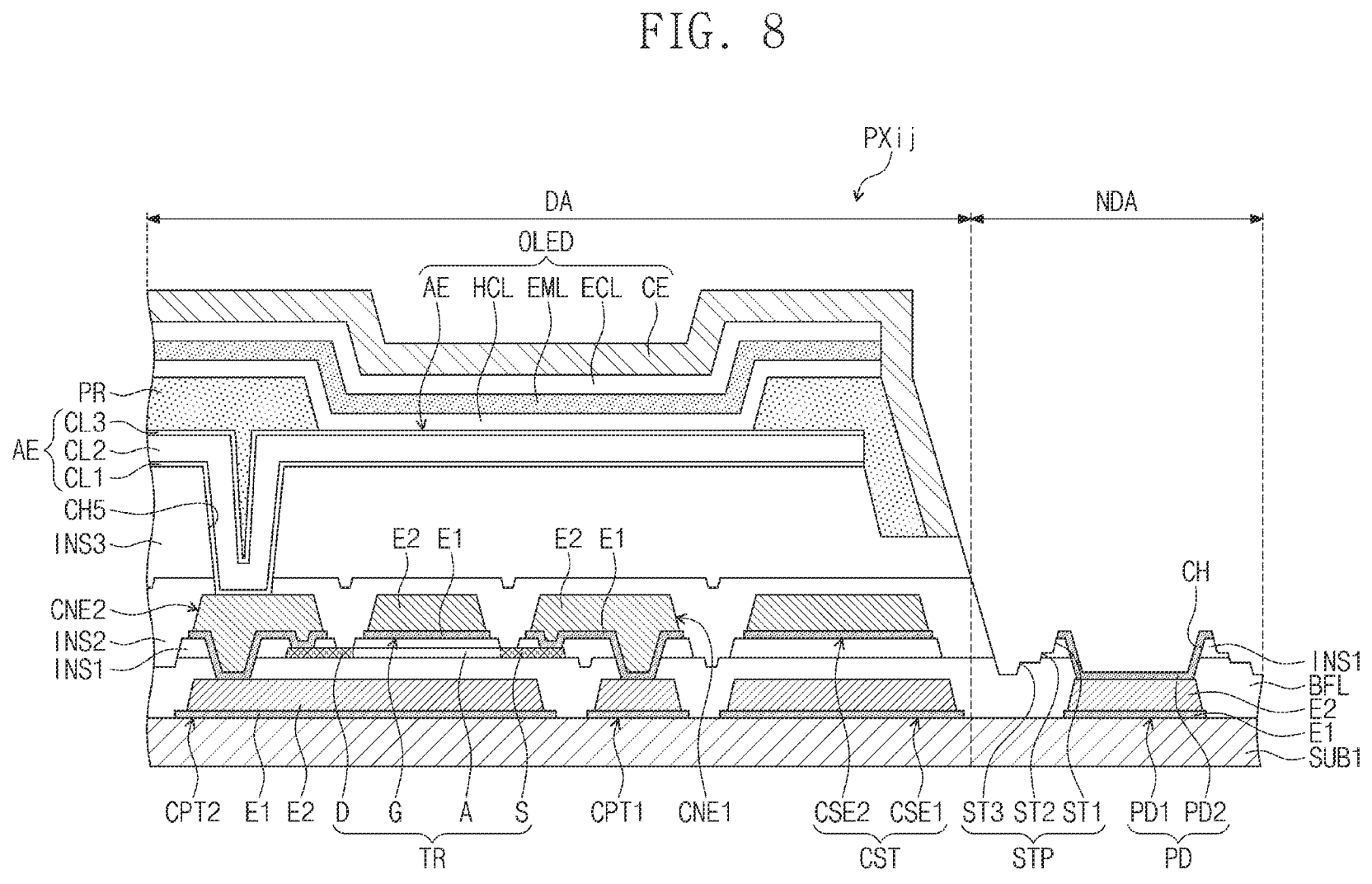
Figure 9:
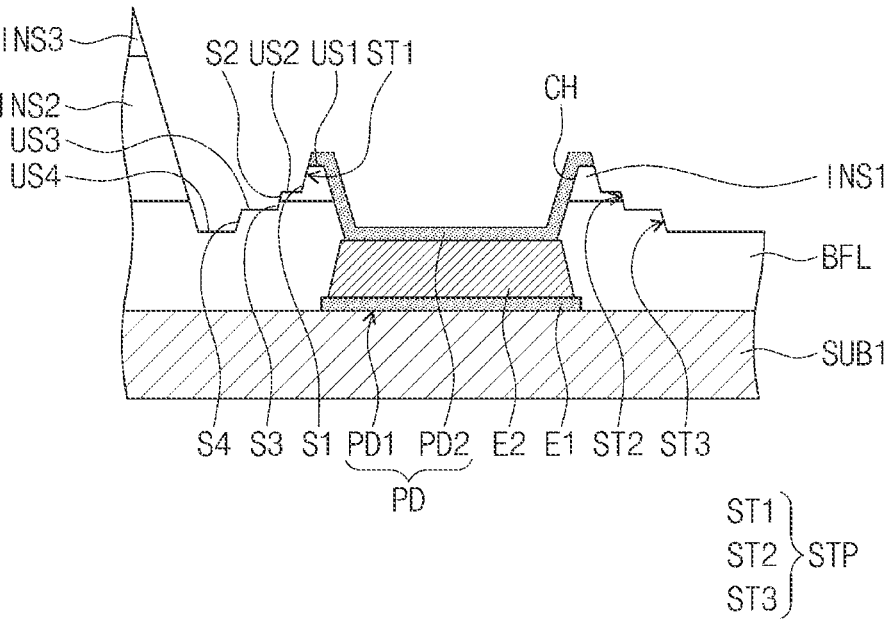
FIG. 9 is an enlarged view of a pad illustrated in FIG. 8.

FIG. 8 is a schematic-cross sectional view illustrating of a portion of the display area and a portion of the non-display area of the display panel illustrated in FIG. 4. FIG. 9 is an enlarged view of a pad illustrated in FIG. 8.

FIG. 8 illustrates an enlarged sectional view of a pixel PXij and a pad PD adjacent to the border between the display area DA and the non-display area NDA.

Referring to FIGS. 8 and 9, the pixel PXij and the pad PD may be disposed on the first substrate SUB1. The first substrate SUB1 may include the display area DA and the non-display area NDA around the display area DA. The pixel PXij may be disposed on the display area DA of the first substrate SUB1, and the pad PD may be disposed on the non-display area NDA of the first substrate SUB1. Accordingly, the pad PD may be disposed around the pixel PXij. A portion of the third insulating layer INS3 that is adjacent to the non-display area NDA may have a step (reference numeral not shown) (hereinafter, referred to as the step portion of the third insulating layer INS3).

The transistor TR, the capacitor CST, the first and second conductive patterns CPT1 and CPT2, and the first and second connecting electrodes CNE1 and CNE2 are illustrated to be larger in FIG. 8 than in FIG. 6. The configurations of the transistor TR, the capacitor CST, the first and second conductive patterns CPT1 and CPT2, and the first and second connecting electrodes CNE1 and CNE2 have been described above in detail with reference to FIG. 6, and therefore descriptions thereabout will be omitted. However, a stacked structure of the transistor TR, the capacitor CST, the first and second conductive patterns CPT1 and CPT2, and the first and second connecting electrodes CNE1 and CNE2, which is illustrated in FIG. 8, will be described below.

The first conductive pattern CPT1, the second conductive pattern CPT2, and the first electrode CSE1 may each include a first electrode E1 and a second electrode E2 disposed on the first electrode E1. The gate electrode G, the first connecting electrode CNE1, the second connecting electrode CNE2, and the second electrode CSE2 may each include a first electrode E1 and a second electrode E2 disposed on the first electrode E1. The second electrode E2 may be thicker than the first electrode E1. In this specification, a thickness may be defined as a numerical value measured with respect to the third direction DR3 described above.

Each of the first and second electrodes E1 and E2 may be formed of molybdenum (Mo), aluminum (Al), chromium (Cr), gold (Au), titanium (Ti), nickel (Ni), neodymium (Nd), or copper (Cu), or an alloy thereof. For example, the first electrode E1 may contain titanium (Ti), and the second electrode E2 may contain copper (Cu).

The first electrode AE is hereinafter referred to as the anode. The anode AE may include a first conductive layer CL1, a second conductive layer CL2 disposed on the first conductive layer CL1, and a third conductive layer CL3 disposed on the second conductive layer CL2. The second conductive layer CL2 may be disposed between the first conductive layer CL1 and the third conductive layer CL3.

The first and third conductive layers CL1 and CL3 may contain a transparent conductive material such as indium tin oxide (ITO) or indium zinc oxide (IZO). The second conductive layer CL2 may contain metal such as silver (Ag). The second conductive layer CL2 may be thicker than the first and third conductive layers CL1 and CL3.

The second insulating layer INS2 may not be disposed on the pad PD. The pad PD may include a first pad electrode PD1 and a second pad electrode PD2 disposed on the first pad electrode PD1.

The first pad electrode PD1 may be disposed in a same layer as the first and second conductive patterns CPT1 and CPT2. The first pad electrode PD1 may be formed of a same material or a similar material as the first and second conductive patterns CPT1 and CPT2. For example, the first pad electrode PD1 may include a first electrode E1 and a second electrode E2 disposed on the first electrode E1. The structure of the first pad electrode PD1 may be defined as a double stacked structure.

The second pad electrode PD2 may be disposed in a same layer as the gate electrode G. As an example, the second pad electrode PD2 may be formed of a same material or a similar material as the first electrode E1 of the gate electrode G and may be disposed in a same layer as the first electrode E1 of the gate electrode G. For example, the second pad electrode PD2 may include a first electrode E1.

The buffer layer BFL may be disposed on the first pad electrode PD1. The buffer layer BFL may be disposed on the first substrate SUB1 to cover or overlap the first pad electrode PD1. The first insulating layer INS1 may be disposed on the buffer layer BF. A contact hole CH may be defined in the first insulating layer INS1 and the buffer layer BFL.

The second pad electrode PD2 may be disposed on the first insulating layer INS1. The second pad electrode PD2 may make contact with the first pad electrode PD1 through the contact hole CH. The second pad electrode PD2 may be electrically connected to the first pad electrode PD1. The second pad electrode PD2 may be connected to the second electrode E2 of the first pad electrode PD1.

Although not illustrated, a connecting pad disposed on the lower surface of the flexible circuit board may be connected to the second pad electrode PD2. This configuration will be illustrated in a manufacturing method of the display device according to an embodiment.

In case that the buffer layer BFL is disposed on the first and second conductive patterns CPT1 and CPT2, the first electrode CSE1, and the first pad electrode PD1, a step may be formed on the buffer layer BFL depending on the thicknesses of the first and second conductive patterns CPT1 and CPT2, the first electrode CSE1, and the first pad electrode PD1. Due to the step formed on the buffer layer BFL, the buffer layer BFL may have a wavy upper surface.

As an example, the upper surface of the buffer layer BFL on the first conductive pattern CPT1, the second conductive pattern CPT2, the first electrode CSE1, and the first pad electrode PD1 may be located (or disposed) in a higher position than the upper surface of the buffer layer BFL between the first conductive pattern CPT1, the second conductive pattern CPT2, the first electrode CSE1, and the first pad electrode PD1.

A step may be formed on the upper surface of the second insulating layer INS2 depending on thicknesses of the first connecting electrode CNE1, the second connecting electrode CNE2, the gate electrode G, and the second electrode CSE2. A step may be formed on the first insulating layer INS1 depending on the semiconductor pattern D, A, and S. However, the step of the first insulating layer INS1 is not illustrated.

A triple step STP may be defined on the first insulating layer INS1 and the buffer layer BFL that are around the first pad electrode PD1 and the second pad electrode PD2. The triple step STP may include a first step ST1, a second step ST2, and a third step ST3.

A side surface of the buffer layer BFL and a side surface of the first insulating layer INS1 may be formed around the second pad electrode PD2, and the first, second, and third steps ST1, ST2, and ST3 may be defined in the form of stairs on the side surface of the buffer layer BFL and the side surface of the first insulating layer INS1. The first, second, and third steps ST1, ST2, and ST3 may be defined in the form of three stairs. The first, second, and third steps ST1, ST2, and ST3 may have a stair form adjacent to the first insulating layer INS1 from the third step ST3 toward the first step ST1.

Referring to FIG. 9, the first step ST1, the second step ST2, and the third step ST3 may be continuously defined in a downward direction on the first insulating layer INS1 and the buffer layer BFL that are around the first pad electrode PD1 and the second pad electrode PD2. The third step ST3 may be a step defined on the buffer layer BFL depending on the thickness of the first pad electrode PD1 described above.

Around the second pad electrode PD2, the buffer layer BFL may be disposed to protrude above the first pad electrode PD1 from the periphery of the first pad electrode PD1 depending on the thickness of the first pad electrode PD1. The third step ST3 may be formed due to the difference in height between the buffer layer BFL disposed on the first substrate SUB1 and the buffer layer BFL disposed on the first pad electrode PD1. A structure related to the third step ST3 is more clearly illustrated in FIG. 10 and will be described below in detail with reference to FIG. 10.

The first and second steps ST1 and ST2 may be formed according to a manufacturing method of the display device DD, and the forming process will be described below in detail.

The first step ST1 may be defined on the first insulating layer INS1, and the third step ST3 may be defined on the buffer layer BFL. The second step ST2 may be continuously defined on the first insulating layer INS1 and the buffer layer BFL.

The third step ST3 may be defined in a stair form on the buffer layer BFL around the pad PD. The second step ST2 may be located (or disposed) above the third step ST3 and may be defined in a stair form on the first insulating layer INS1 and the buffer layer BFL that are around the pad PD. The first step ST1 may be located (or disposed) above the second step ST2 and may be defined in a stair form on the first insulating layer INS1 around the pad PD.

The second step ST2 may be disposed below the first step ST1 and may be disposed outward of the first step ST1. The third step ST3 may be disposed below the second step ST2 and may be disposed outward of the second step ST2.

First, second, third, and fourth side surfaces S1, S2, S3, and S4 may be defined on the first insulating layer INS1 and the buffer layer BFL that are around the second pad electrode PD2. The first, second, and third steps ST1, ST2, and ST3 may be formed by the first, second, third, and fourth side surfaces S1, S2, S3, and S4. Structures of the first, second, and third steps ST1, ST2, and ST3 depending on the first, second, third, and fourth side surfaces S1, S2, S3, and S4 will be described below in detail.

The first step ST1 may be defined by a first upper surface US1 of the first insulating layer INS1, the first side surface S1 of the first insulating layer INS1, and a second upper surface US2 of the first insulating layer INS1.

The first upper surface US1 may be defined as the uppermost surface of the first insulating layer INS1 that makes contact with the second pad electrode PD2. The first upper surface US1 may be defined as an upper surface of the first insulating layer INS1 in which the contact hole CH is not defined. The side surface of the first insulating layer INS1 that defines the contact hole CH may be defined as an inside surface (reference numeral not shown) of the first insulating layer INS1. The second pad electrode PD2 may be disposed on the upper surface of the first pad electrode PD1, the inside surface of the first insulating layer INS1, and the first upper surface US1.

The first side surface S1 may extend downward from an end of the first upper surface US1 that overlaps an end of the second pad electrode PD2. The first side surface S1 may form an obtuse angle with the first upper surface US1. The first side surface S1 may be formed to be a same side surface as the end of the second pad electrode PD2. The second upper surface US2 may extend outward from a lower end of the first side surface S1 parallel to the first upper surface US1.

The second step ST2 may be defined by the second upper surface US2 of the first insulating layer INS1, the second side surface S2 of the first insulating layer INS1, the third side surface S3 of the buffer layer BFL, and the third upper surface US3 of the buffer layer BFL.

The second side surface S2 may extend downward from an end of the second upper surface US2 and may be disposed outward of the first side surface S1. The third side surface S3 may be disposed below the second side surface S2 and may be formed to be a same side surface as the second side surface. The second side surface S2 and the third side surface S3 may form an obtuse angle with the second upper surface. The third upper surface US3 may extend outward from a lower end of the third side surface S3 parallel to the second upper surface US2. A lower surface of the first insulating layer INS1 under or below the first upper surface US1 and a lower surface of the first insulating layer INS1 under or below the second upper surface US2 may be formed on a same plane.

The third step ST3 may be defined by the third upper surface US3 of the buffer layer BFL, the fourth side surface S4 of the buffer layer BFL, and the fourth upper surface US4 of the buffer layer BFL.

The fourth side surface S4 may extend downward from an end of the third upper surface US3 and may be disposed outward of the third side surface S3. The fourth side surface S4 may form an obtuse angle with the third upper surface US3. The fourth upper surface US4 may extend outward from a lower end of the fourth side surface S4 parallel to the third upper surface US3.

FIGS. 10 to 18 are views for explaining a method of manufacturing the display device according to an embodiment.

Figure 10:
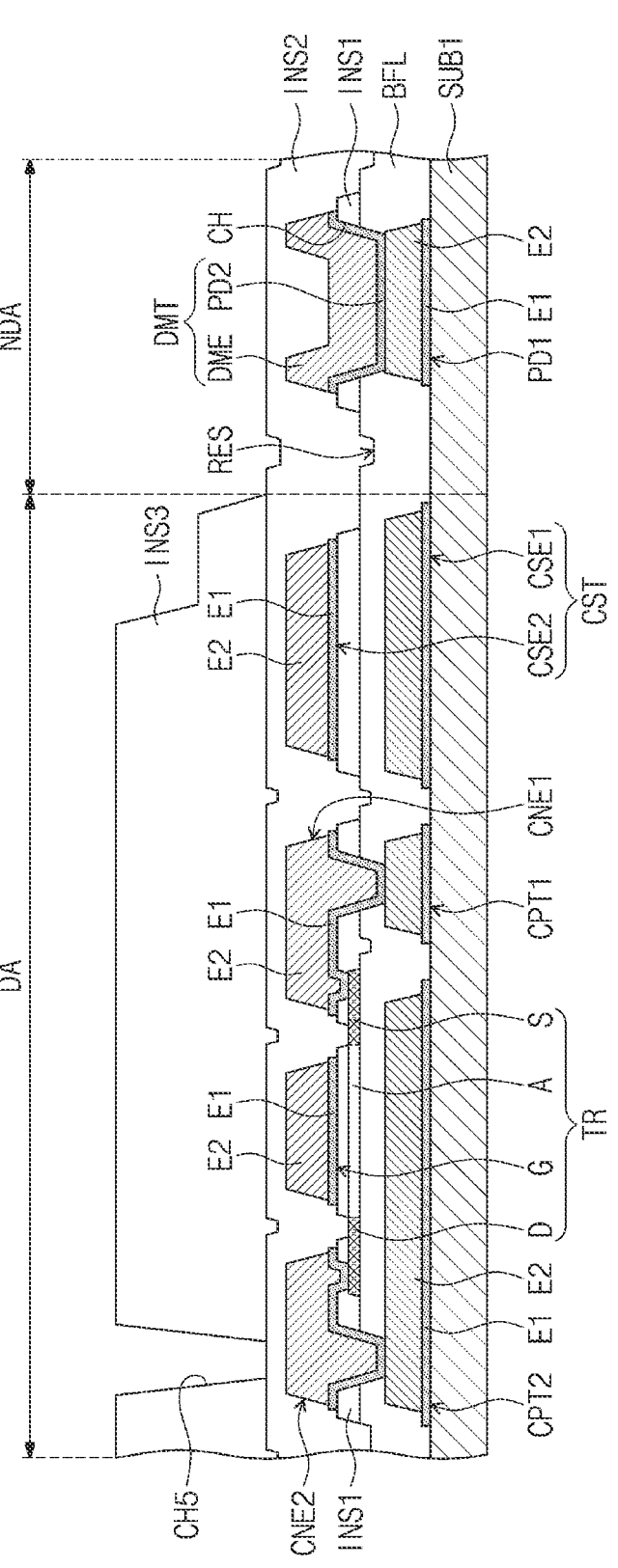
Figure 11:
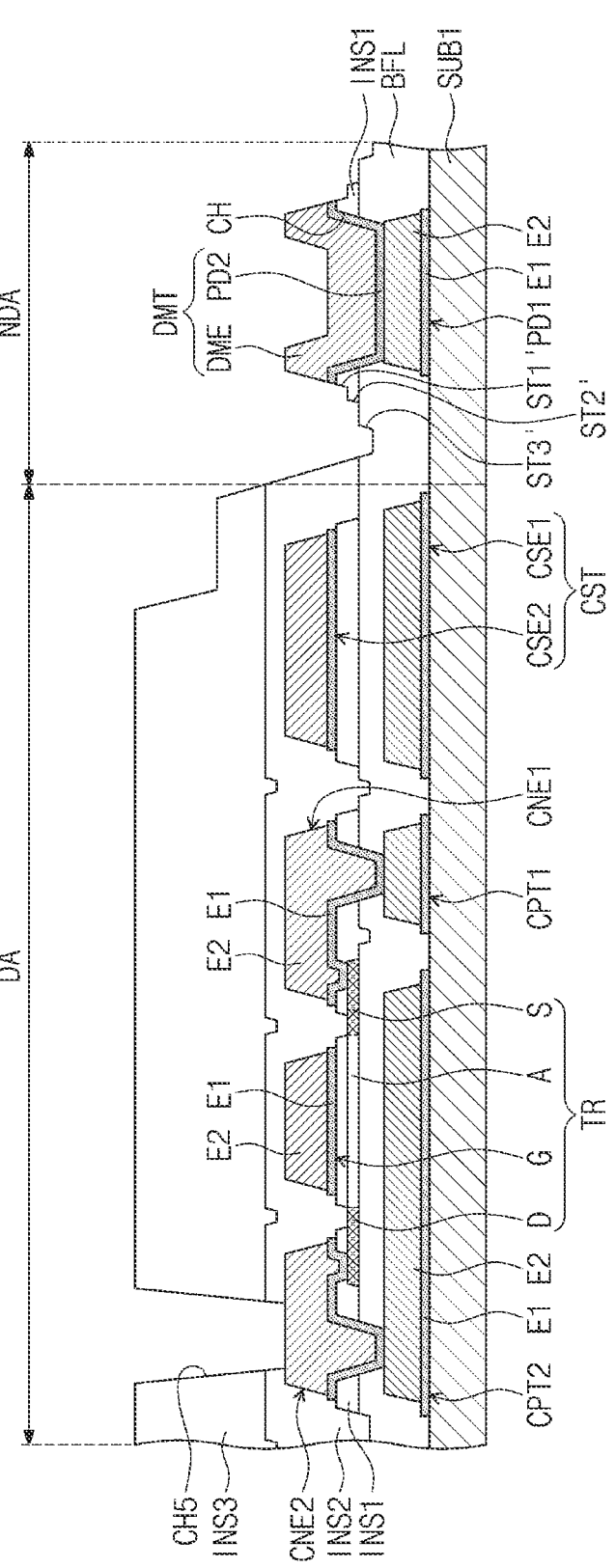
Figure 12:
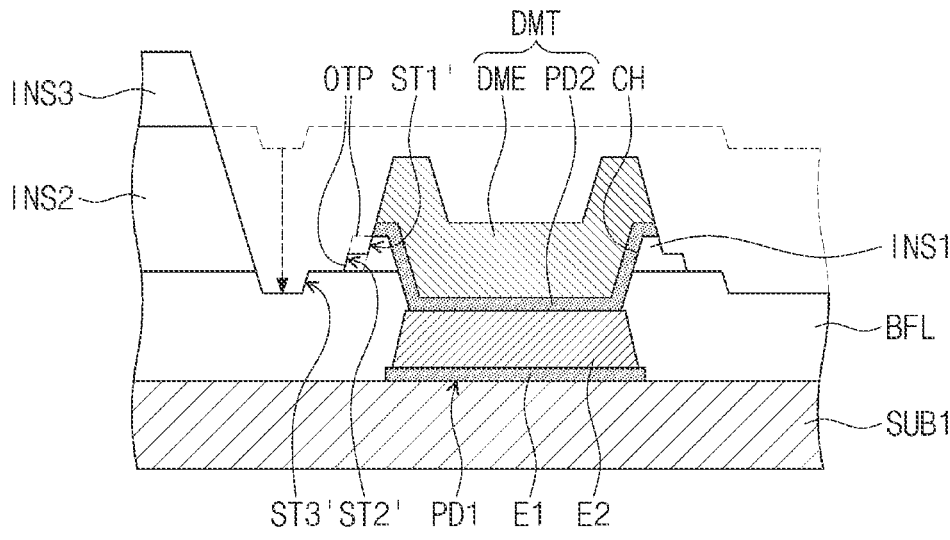
Figure 14:
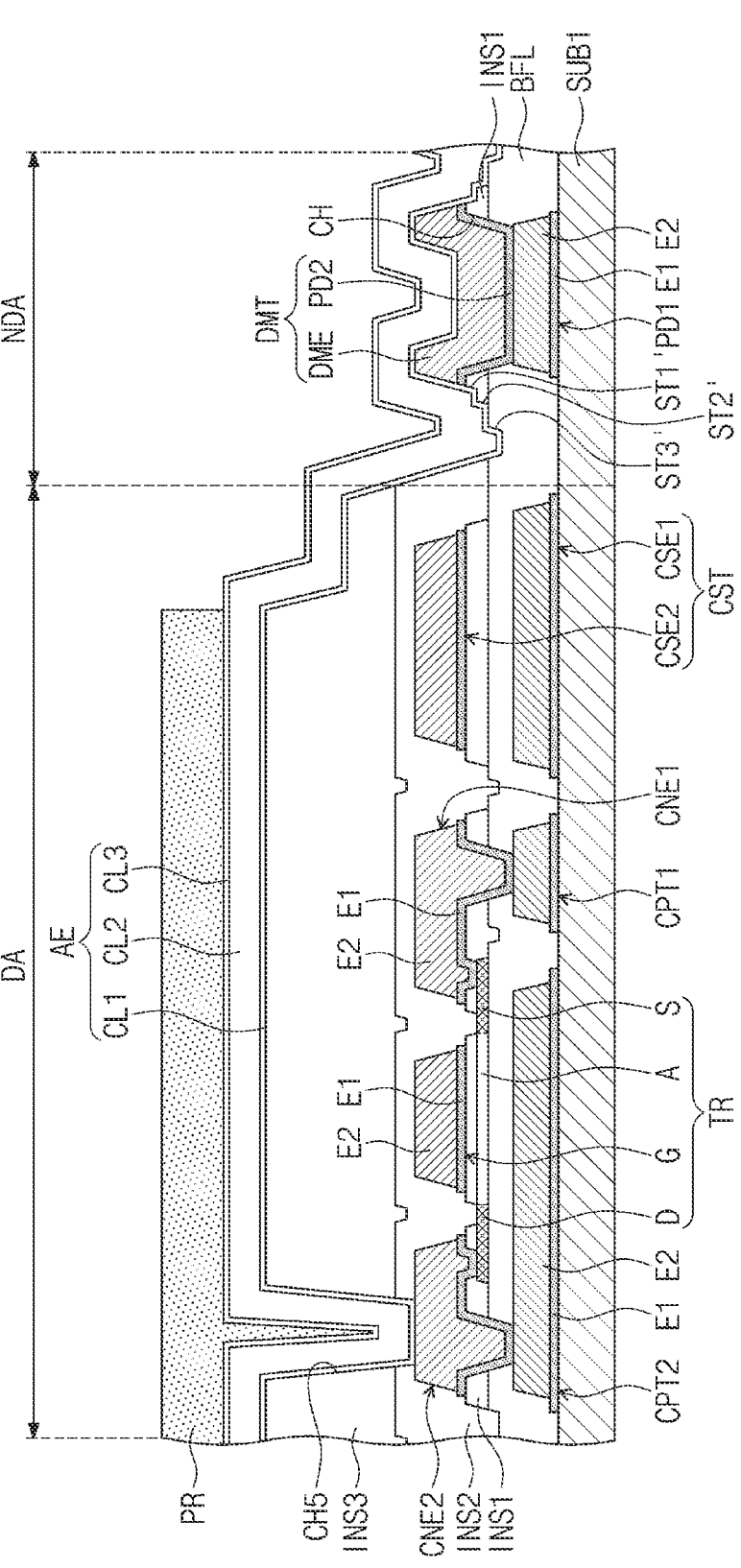
Figure 15:
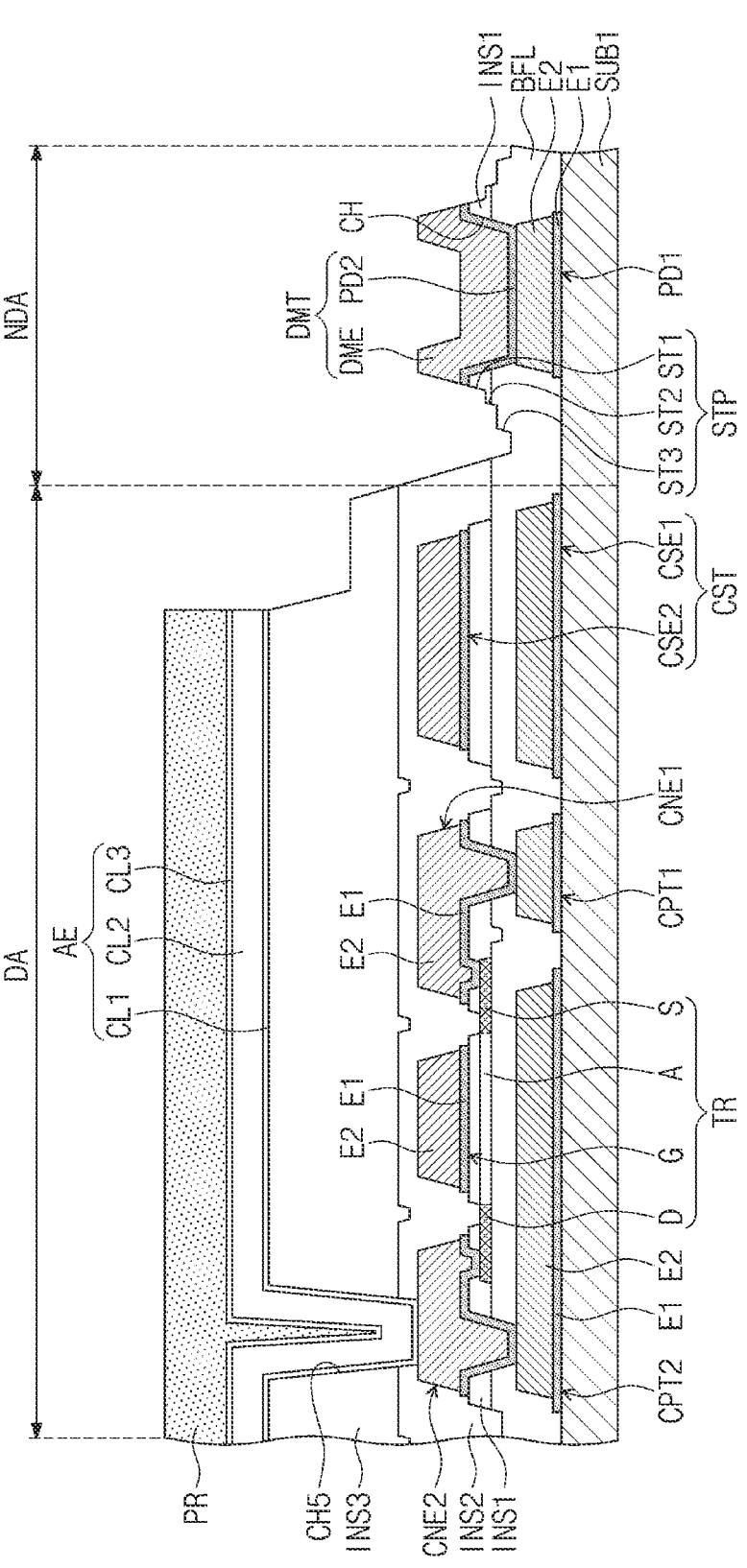
Figure 16:
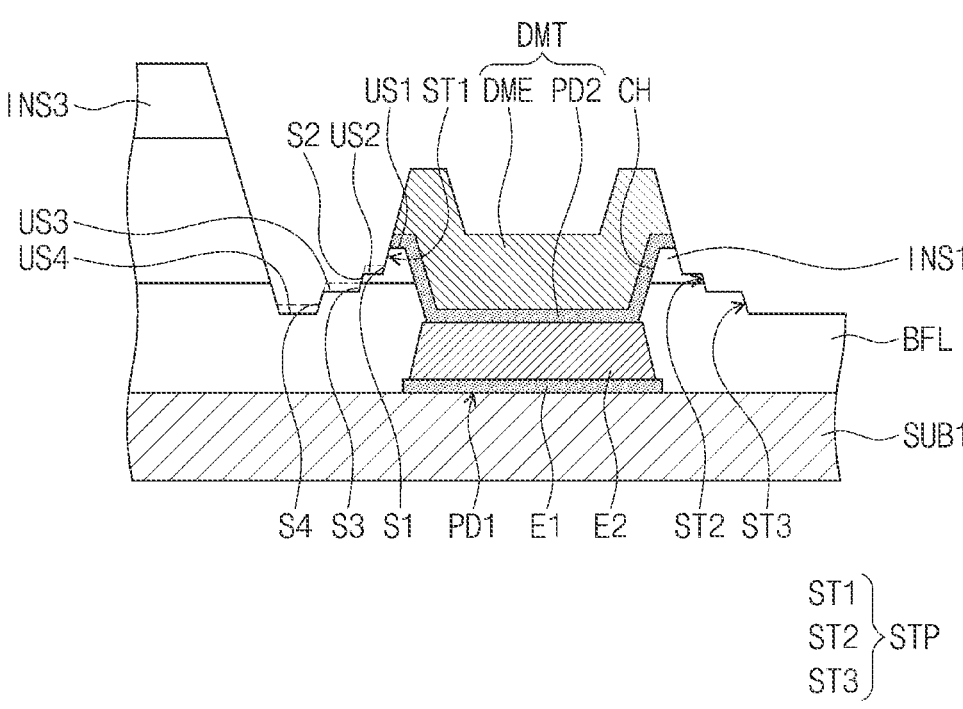

FIGS. 10, 11, 13 to 15, 17, and 18 are schematic-cross sectional views corresponding to FIG. 8, and FIGS. 12 and 16 are schematic-cross sectional views corresponding to FIG. 9.

Referring to FIG. 10, the first and second conductive patterns CPT1 and CPT2, the transistor TR, the first and second connecting electrodes CNE1 and CNE2, the capacitor CST, the buffer layer BFL, and the first to third insulating layers INS1 to INS3 may be provided on the display area DA of the first substrate SUB1. The first pad electrode PD1 may be provided on the non-display area NDA of the first substrate SUB1.

In the non-display area NDA, the buffer layer BFL and the first insulating layer INS1 may be sequentially provided on the first pad electrode PD1. The buffer layer BFL may be provided on the first substrate SUB1 to cover or overlap the first pad electrode PD1.

A dummy metal DMT may be provided on the first insulating layer INS1. The dummy metal DMT may make contact with the first pad electrode PD1 through the contact hole CH defined in the first insulating layer INS1 and the buffer layer BFL. The dummy metal DMT may be electrically connected to the first pad electrode PD1.

The dummy metal DMT may be disposed in a same layer as the gate electrode G, the first and second connecting electrodes CNE1 and CNE2, and the second electrode CSE2. The dummy metal DMT may be formed over the first substrate SUB1 by being simultaneously subjected to patterning with a same material or a similar material as the gate electrode G, the first and second connecting electrodes CNE1 and CNE2, and the second electrode CSE2.

The dummy metal DMT may include the second pad electrode PD2 and a dummy electrode DME disposed on the second pad electrode PD2. The second pad electrode PD2 may contain a same material or a similar material as the first electrode E1, and the dummy electrode DME may contain a same material or a similar material as the second electrode E2. The structure of the dummy metal DMT may be defined as a double stacked structure.

The first insulating layer INS1 disposed over the non-display area NDA may be separated from the first insulating layer INS1 disposed over the display area DA. In the following description, the first insulating layer INS1 may indicate the first insulating layer INS1 disposed over the non-display area NDA.

The first insulating layer INS1 may be disposed to overlap the dummy metal DMT in a plan view. The first insulating layer INS1 may not be disposed around the dummy metal DMT in a plan view. The periphery of the first insulating layer INS1 may protrude outward of the periphery of the dummy metal DMT in a plan view.

In the non-display area NDA, the second insulating layer INS2 may be provided on the dummy metal DMT. The second insulating layer INS2 may be provided on the buffer layer BFL to cover or overlap the dummy metal DMT. The third insulating layer INS3 may not be provided over the non-display area NDA.

The buffer layer BFL may be disposed on the first conductive pattern CPT1, the second conductive pattern CPT2, the first electrode CSE1, and the first pad electrode PD1. The buffer layer BFL may be disposed on the first substrate SUB1 between the first conductive pattern CPT1, the second conductive pattern CPT2, the first electrode CSE1, and the first pad electrode PD1. The buffer layer BFL disposed on the first conductive pattern CPT1, the second conductive pattern CPT2, the first electrode CSE1, and the first pad electrode PD1 may be located (or disposed) above the buffer layer BFL disposed on or directly disposed on the first substrate SUB1.

Depending on this structure, the upper surface of the buffer layer BFL may be recessed downward between the first conductive pattern CPT1, the second conductive pattern CPT2, the first electrode CSE1, and the first pad electrode PD1. Accordingly, a height difference may be formed between the buffer layer BFL disposed on or directly disposed on the first substrate SUB1 and the buffer layer BFL disposed on the first conductive pattern CPT1, the second conductive pattern CPT2, the first electrode CSE1, and the first pad electrode PD1. Depending on the height difference, a recess RES may be formed on the upper surface of the buffer layer BFL between the first electrode CSE1 and the first pad electrode PD1.

Due to the thickness of the first pad electrode PD1, the buffer layer BFL disposed on the first pad electrode PD1 may be located (or disposed) above the buffer layer BFL disposed on or directly disposed on the first substrate SUB1 so that the recess RES may be formed. The recess RES of the buffer layer BFL may form the above-described third step ST3 according to a manufacturing process to be described below.

Referring to FIG. 11, the portion of the second insulating layer INS2 disposed over the non-display area NDA may be removed, with the third insulating layer INS3 as a mask. In a plan view, the portion of the second insulating layer INS2 that overlaps the non-display area NDA may be removed by dry etching. In case that the second insulating layer INS2 is removed, a portion of the first insulating layer INS1 may be removed. In case that the second insulating layer INS2 is removed, the upper surface of the third insulating layer INS3 may be removed to a depth.

FIG. 12 is an enlarged view of the first pad and the dummy metal illustrated in FIG. 11.

Referring to FIGS. 11 and 12, in case that the second insulating layer INS2 over the non-display area NDA is removed by the dry etching, the first insulating layer INS1 may be removed together. The portion of the first insulating layer INS1 located (or disposed) outward of the dummy metal DMT may be removed, with the dummy metal DMT as a mask. In FIG. 12, the portion before the etching is illustrated by dotted lines.

The portion of the first insulating layer INS1 located (or disposed) outward of the dummy metal DMT may be defined as an outer portion OTP. In case that the second insulating layer INS2 is removed, part of the outer portion OTP rather than the entire outer portion OTP may be removed. For example, the outer portion OTP may be removed from the upper surface of the outer portion OTP to a portion between the upper surface and the lower surface of the outer portion OTP.

A first step ST1' and a second step ST2' may be defined on the periphery of the first insulating layer INS1 by the removal of the part of the outer portion OTP. The second step ST2' may be disposed below the first step ST1' and may be disposed outward of the first step ST1'.

A third step ST3' may be formed by the above-described recess RES. As described above, the third step ST3' may be formed on the buffer layer BFL depending on the thickness of the first pad electrode PD1. The third step ST3' may be disposed below the second step ST2' and may be disposed outward of the second step ST2'. Accordingly, the first step ST1', the second step ST2', and the third step ST3' may be continuously formed in a downward direction. The first step ST1' and the second step ST2' may be formed in the step in which the portion of the second insulating layer INS2 is removed.

The etch rate of the first insulating layer INS1 and the etch rate of the second insulating layer INS2 may differ from each other. The etch rate of the first insulating layer INS1 may be lower than the etch rate of the second insulating layer INS2. For example, in case that the first insulating layer INS1 contains silicon oxide SiOx and the second insulating layer INS2 contains silicon nitride SiNx, the etch rate of the first insulating layer INS1 may be lower than the etch rate of the second insulating layer INS2.

Because the etch rate of the first insulating layer INS1 is lower than the etch rate of the second insulating layer INS2, part of the outer portion OTP rather than the entire outer portion OTP may be removed even though all of the second insulating layer INS2 over the non-display area NDA is removed in the dry etching process. The first step ST1' and the second step ST2' may be formed on the first insulating layer INS1 by the removal of the part of the outer portion OTP.

The form of three stairs may be defined on the first insulating layer INS1 and the buffer layer BFL by the first, second, and third steps ST1', ST2', and ST3'. The first, second, and third steps ST1', ST2', and ST3' may be defined as a triple step.

Figure 13:
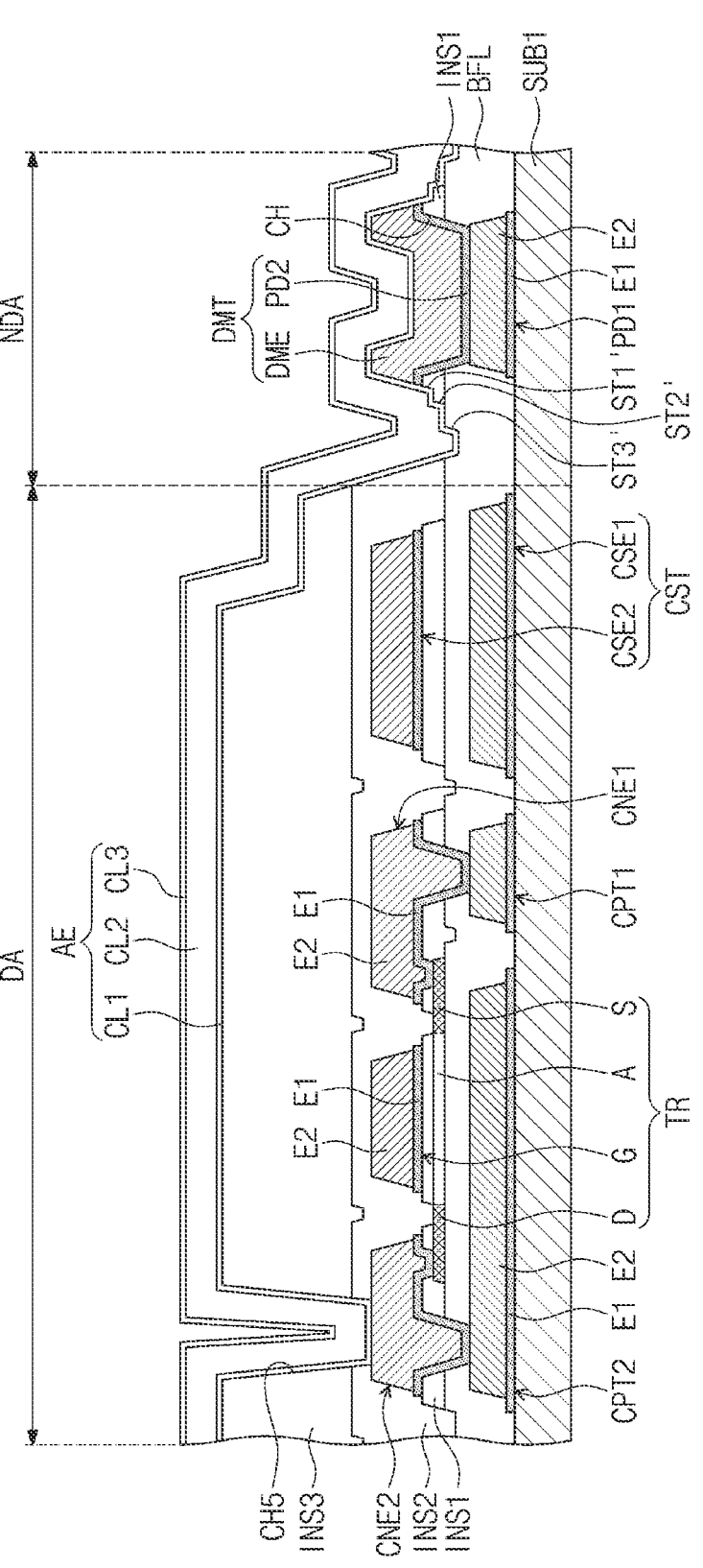

Referring to FIG. 13, the anode AE may be provided over the display area DA and the non-display area NDA. The anode AE may be disposed on the third insulating layer INS3, the buffer layer BFL, the first insulating layer INS1, and the dummy metal DMT.

Referring to FIG. 14, photoresist PR may be provided on the anode AE over the display area DA. The photoresist PR may be spaced apart from the border between the display area DA and the non-display area NDA and may overlap the third insulating layer INS3. The photoresist PR may be spaced apart from the step portion of the third insulating layer INS3 and may be provided on the third insulating layer INS3. The photoresist PR may not be provided on the non-display area NDA and the step portion of the third insulating layer INS3.

Referring to FIG. 15, the portion of the anode AE exposed by the photoresist PR may be removed, with the photoresist PR as a mask. The anode AE may be removed by a wet etching process. The anode AE may be removed in a stepwise manner. The third conductive layer CL3 and the second conductive layer CL2 may be etched, and thereafter the first conductive layer CL1 may be etched.

The portion of the anode AE disposed over the non-display area NDA and the step portion of the third insulating layer INS3 may be removed. Accordingly, the anode AE may be provided on the third insulating layer INS3 in the display area DA. The anode AE may not be disposed over the non-display area NDA and the step portion of the third insulating layer INS3.

After the anode AE is removed, an ashing process may be performed. The third insulating layer INS3 has to be disposed over the display area DA, but does not have to be disposed over the non-display area NDA. Although not illustrated, the third insulating layer INS3 may remain over the non-display area NDA without being entirely removed in the manufacturing process. To remove materials of the third insulating layer INS3 remaining over the non-display area NDA, the ashing process may be performed on the non-display area NDA.

The ashing process may be performed by dry etching using 02 gas. In case that the ashing process is performed, the first, second, and third steps ST1', ST2', and ST3' illustrated in FIG. 12 may be more deeply etched. As a result, the first, second, and third steps ST1, ST2, and ST3 according to an embodiment, which are illustrated in FIG. 15, may be formed.

The first step ST1' and the second step ST2' formed in the step in which the portion of the second insulating layer INS2 disposed over the non-display area NDA is removed may be more deeply etched by the ashing process to form the first step ST1 and the second step ST2. For example, the first step ST1 and the second step ST2 may be determined to be substantially formed on the first insulating layer INS in the step of removing the portion of the second insulating layer INS2 rather than the ashing process.

FIG. 16 is an enlarged view of the first, second, and third steps illustrated in FIG. 15.

In FIG. 16, the portion before the etching is illustrated by dotted lines.

Referring to FIG. 16, the first, second, and third steps ST1', ST2', and ST3' may be more deeply etched by the ashing process to form the first, second, and third steps ST1, ST2, and ST3 according to an embodiment. The configurations of the first, second, and third steps ST1, ST2, and ST3 have been described above in detail with reference to FIG. 9, and therefore descriptions thereabout will be omitted.

Figure 17:
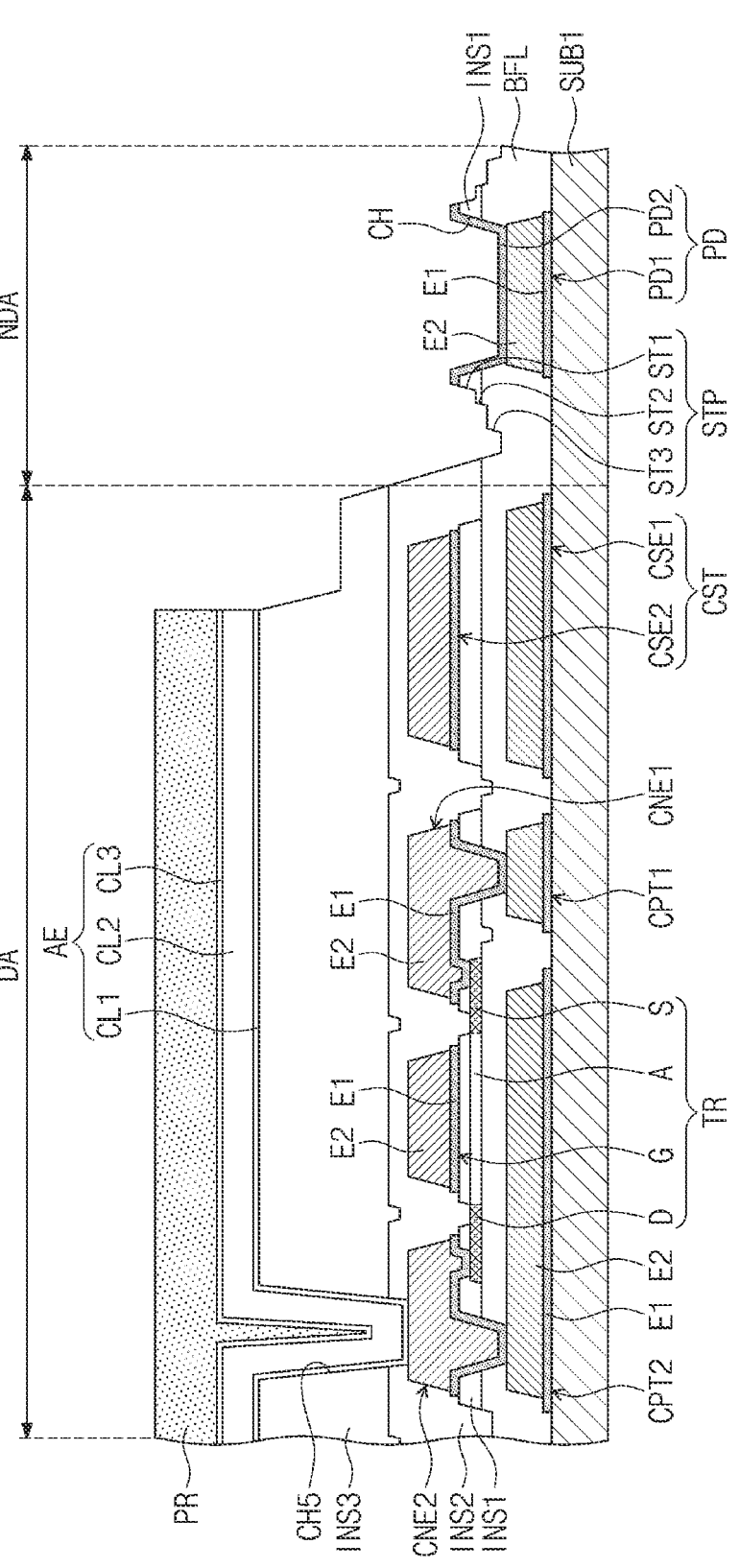

Referring to FIG. 17, the dummy electrode DME on the second pad electrode PD2 may be removed. Accordingly, the first step ST1, the second step ST2, and the third step ST3 may be continuously defined in a downward direction on the first insulating layer INS1 and the buffer layer BFL that are around the first pad electrode PD1 and the second pad electrode PD2. Furthermore, the pad PD including the first pad electrode PD1 and the second pad electrode PD2 may be formed.

Figure 18:
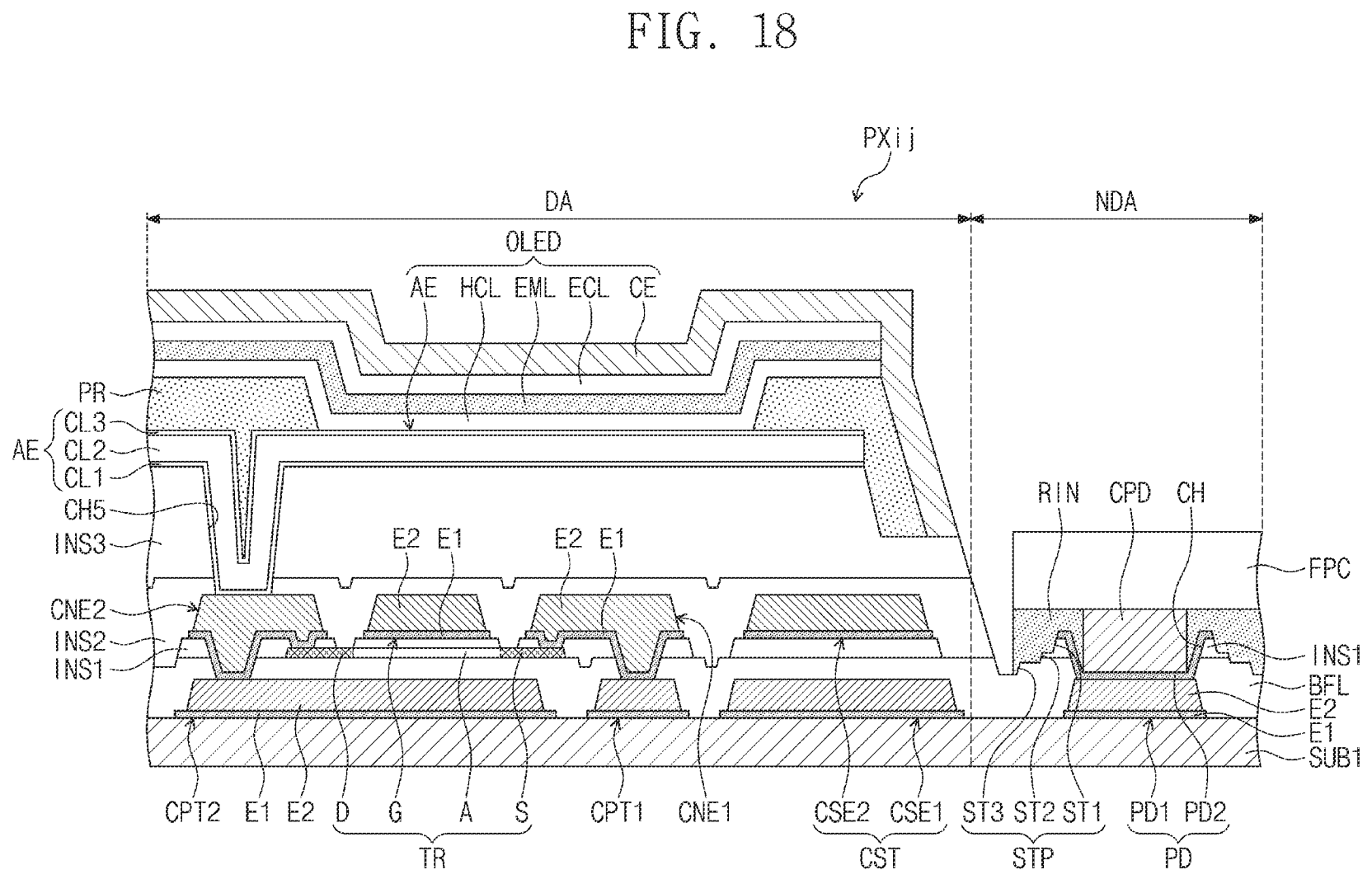

Referring to FIG. 18, the pixel defining film PDL may be provided on the anode AE. The pixel defining film PDL may be provided over the display area DA. The hole control layer HCL, the emissive layer EML, the electron control layer ECL, and the second electrode CE may be provided on the anode AE to form the light emitting element OLED. The light emitting element OLED may be provided over the display area DA.

A flexible circuit film FPC may be disposed over the pad PD, and a connecting pad CPD may be disposed on the lower surface of the flexible circuit film FPC. The connecting pad CPD may be disposed to overlap the pad PD in a plan view. The connecting pad CPD may be brought into contact with and electrically connected to the pad PD by a bonding process. The connecting pad CPD may be brought into contact with the second pad electrode PD2. Although not illustrated, the data driver connected to the connecting pad CPD may be disposed on the flexible circuit film FPC.

A resin RIN may be disposed around the second pad electrode PD2 and the connecting pad CPD brought into contact with each other. The resin RIN may be disposed under or below the flexible circuit film FPC and may protect the second pad electrode PD2 and the connecting pad CPD such that the second pad electrode PD2 and the connecting pad CPD are not exposed to the outside.

To form a pad, a second pad electrode having a triple or quadruple stacked structure is disposed on the first pad electrode PD1. Hereinafter, the pad including the second pad electrode having the triple or quadruple stacked structure is referred to as the comparative pad. Deposition and etching processes may be performed to form the second pad electrode having the triple or quadruple stacked structure.

In an embodiment, the pad PD including the first and second pad electrodes PD1 and PD2 may be formed by using the first pad electrode PD1 having a double stacked structure and the dummy metal DMT having a double stacked structure. Accordingly, materials and layer structures used for the pad PD may be decreased. As a result, deposition and etching processes for forming the pad PD may be decreased, and the configuration of the pad PD may be simplified.

The second insulating layer INS2 may be disposed on the comparative pad, a portion of the second insulating layer INS2 over the non-display area NDA may be removed to form a contact hole, and the connecting pad CPD may be connected to the comparative pad through the contact hole.

However, in an embodiment, all of the second insulating layer INS2 disposed over the non-display area NDA may be removed. Accordingly, all of the second pad electrode PD2 may be exposed in a bonding process. Because the second pad electrode PD2 is entirely exposed and connected to the connecting pad CPD, the bonding process may be more readily performed. Furthermore, the exposed second pad electrode PD2 may have a greater width than the first pad electrode PD1. This structure will be described below with reference to FIG. 19.

Figure 19:
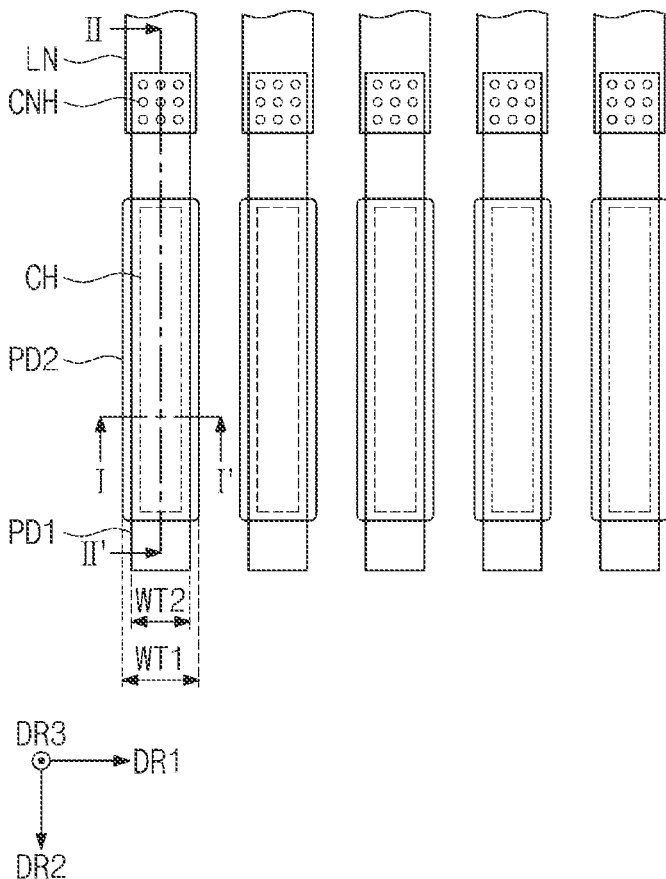
FIG. 19 is a schematic plan view of first and second pad electrodes illustrated in FIG. 18.
Figure 20A:
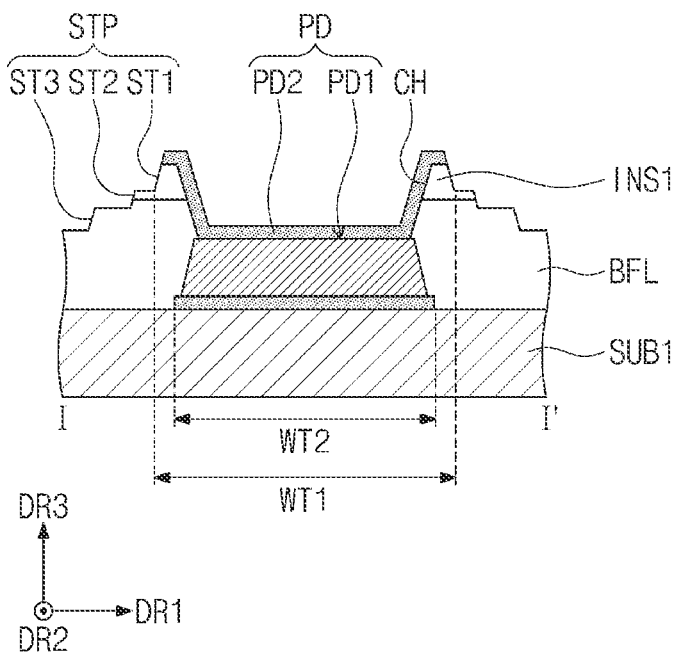
FIG. 20A is a schematic-cross sectional view taken along line I-I' illustrated in FIG. 19.
Figure 20B:
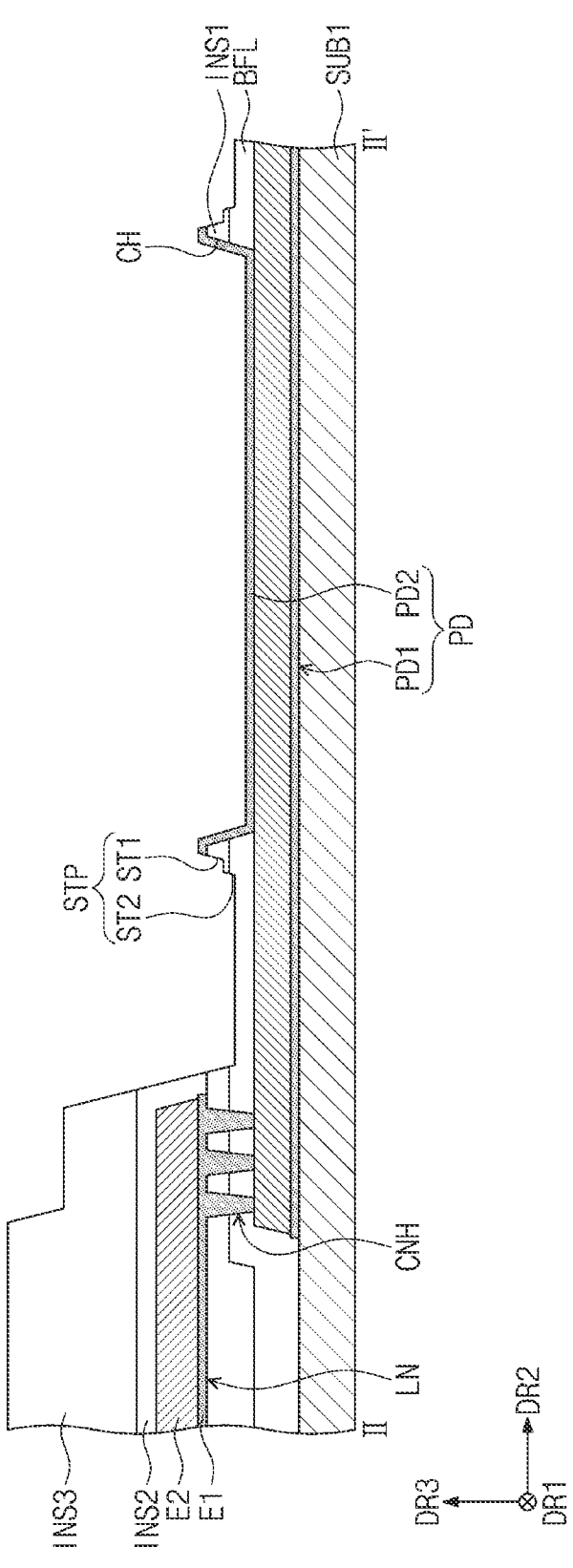
FIG. 20B is a schematic-cross sectional view taken along line II-II' illustrated in FIG. 19.

FIG. 19 is a schematic plan view of the first and second pad electrodes illustrated in FIG. 18. FIG. 20A is a schematic-cross sectional view taken along line I-I' illustrated in FIG. 19. FIG. 20B is a schematic-cross sectional view taken along line II-II' illustrated in FIG. 19.

Referring to FIGS. 18 and 19, first pad electrodes PD1, second pad electrodes PD2, and contact holes CH may be provided. The first pad electrodes PD1, the second pad electrodes PD2, and the contact holes CH may extend in the second direction DR2. The first pad electrodes PD1, second pad electrodes PD2, and the contact holes CH may be arranged (or disposed) in the first direction DR1.

The second pad electrodes PD2 may be disposed on the first pad electrodes PD1, respectively, and the first pad electrodes PD1 may be connected to the second pad electrodes PD2 through the contact holes CH, respectively. The first pad electrodes PD may be connected to lines LN. The lines LN may be the data lines DL1 to DLn described above. Hereinafter, a configuration of one first pad electrode PD1, one second pad electrode PD2, one line LN, and on contact hole CH will be described.

Referring to FIGS. 19, 20A, and 20B, the line LN may be disposed on the first pad electrode PD1. The line LN may be disposed on the first insulating layer INS1. The line LN may include the first electrode E1 and the second electrode E2 described above. The first pad electrode PD1 may be connected to the corresponding line LN through contact holes CNH defined in the first insulating layer INS1 and the buffer layer BFL.

The width WT1 of the second pad electrode PD2 may be greater than the width WT2 of the first pad electrode PD1 in the first direction DR1. Because the second pad electrode PD2 exposed to the outside has a greater width than the first pad electrode PD1 in the first direction DR1, adhesion to the connecting pad CPD may be increased in a bonding process.

Referring to FIGS. 19 and 20B, the first pad electrode PD1 under or below the second pad electrode PD2 may extend longer in the second direction DR2 than the second pad electrode PD2. The first pad electrode PD1 under or below the second pad electrode PD2 may extend in the second direction DR2 and may be disposed under or below the second insulating layer INS2.

Because the first pad electrode PD1 is continuously disposed from below the second pad electrode PD2 to below the second insulating layer INS2, the buffer layer BFL may also extend from below the second pad electrode PD2 to below the second insulating layer INS2 and may be disposed on the first pad electrode PD1. Accordingly, the recess RES described with reference to FIG. 10 may not be formed on the buffer layer BFL illustrated in FIG. 20B. Accordingly, the third step ST3 formed by the recess RES may also not be formed on the buffer layer BFL illustrated in FIG. 20B. The first and second steps ST1 and ST2 may be formed according to the above-described process.

Referring again to FIG. 18, the triple step STP may be formed on the first insulating layer INS1 and the buffer layer BFL around the pad PD by the first, second, and third steps ST1, ST2, and ST3. The triple step STP may have a larger surface area than a single step or a double step. The resin RIN may be disposed around the pad PD. Because the triple step STP has a larger surface area than a single step or a double step, contact of the resin RIN with the triple step STP may be increased. As a result, the resin RIN may be more firmly attached to the triple step STP.

Figure 21:
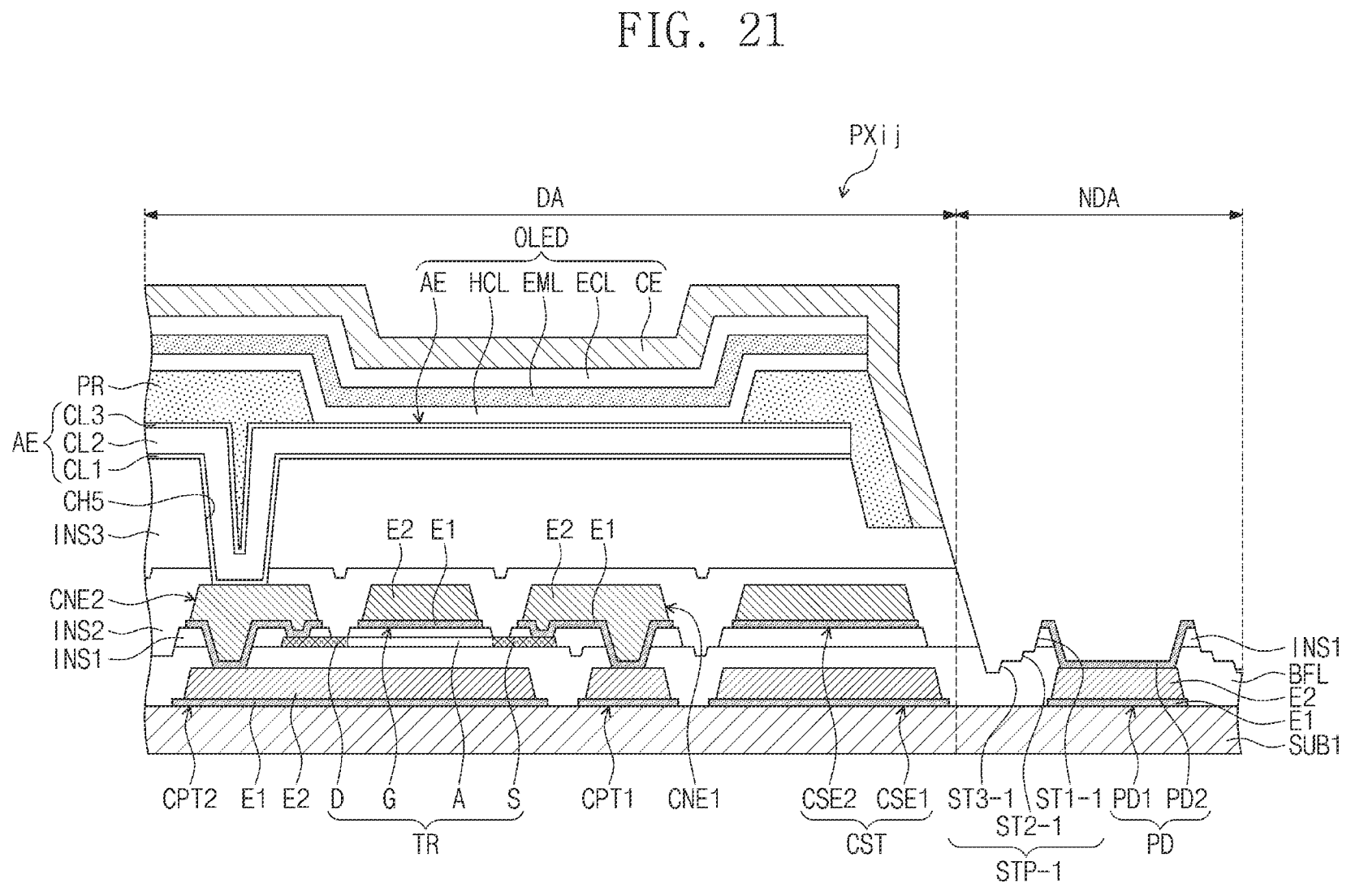
Figure 22:
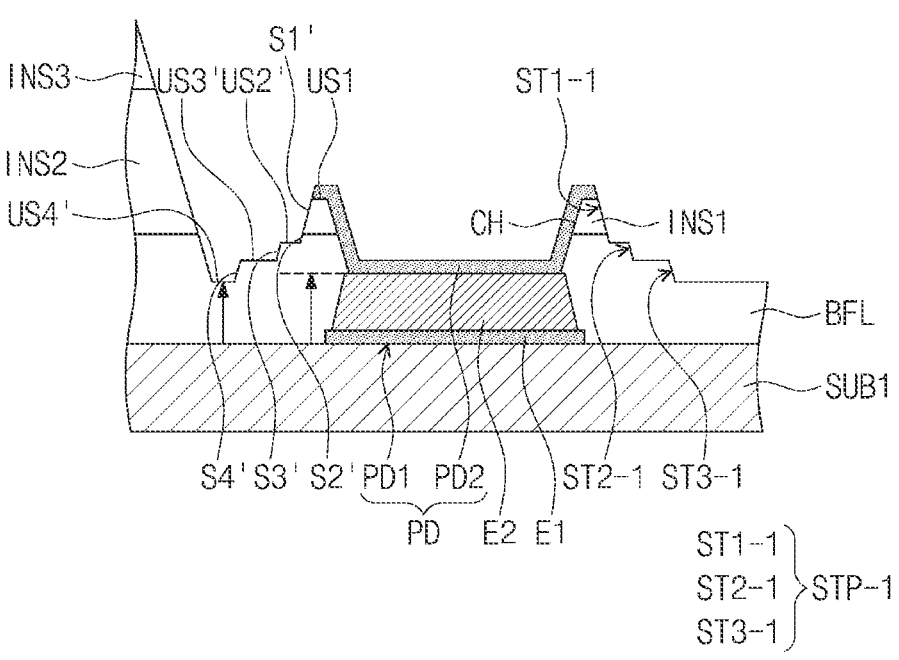
FIG. 22 is an enlarged view of the pad illustrated in FIG. 21.

FIG. 21 is a view illustrating a step structure around a pad according to an embodiment. FIG. 22 is an enlarged view of the pad illustrated in FIG. 21.

FIG. 21 is a schematic-cross sectional view corresponding to FIG. 8, and FIG. 22 is a schematic-cross sectional view corresponding to FIG. 9. Components illustrated in FIGS. 21 and 22 are substantially the same as the components illustrated in FIGS. 8 and 9, except that the structure of a triple step STP-1 differs from the structure of the triple step STP illustrated in FIGS. 8 and 9. Accordingly, the structure of the triple step STP-1 will be described below, and components in FIGS. 21 and 22 that are identical to the components illustrated in FIGS. 8 and 9 will be assigned with the same reference numerals.

Referring to FIGS. 21 and 22, a first step ST1-1, a second step ST2-1, and a third step ST3 may be continuously defined in a downward direction on the first insulating layer INS1 and the buffer layer BFL that are around the first pad electrode PD1 and the second pad electrode PD2.

The first and second steps ST1-1 and ST2-1 may be formed according to a manufacturing method of the display device DD, and the forming process will be described below in detail. The third step ST3-1 may be defined on the buffer layer BFL depending on the thickness of the first pad electrode PD1.

The first step ST1-1 may be continuously defined on the first insulating layer INS1 and the buffer layer BFL. The second step ST2-1 and the third step ST3-1 may be defined on the buffer layer BFL. The second step ST2-1 may be disposed below the first step ST1-1 and may be disposed outward of the first step ST1-1. The third step ST3-1 may be disposed below the second step ST2-1 and may be disposed outward of the second step ST2-1.

The first step ST1-1 may be defined by a first upper surface US1 of the first insulating layer INS1, a first side surface S1' of the first insulating layer INS1, a second side surface S2' of the buffer layer BFL, and a second upper surface US2' of the buffer layer BFL. The first upper surface US1 may be defined as the uppermost surface of the first insulating layer INS1 that makes contact with the second pad electrode PD2.

The first side surface S1' may extend downward from an end of the first upper surface US1 that overlaps an end of the second pad electrode PD2. The first side surface S1' may be formed to be the same side surface as the end of the second pad electrode PD2. The second side surface S2' may be disposed below the first side surface S1' and may be formed to be the same side surface as the first side surface S1'. The first side surface S1' and the second side surface S2' may form an obtuse angle with the first upper surface US1. The second upper surface US2' may extend outward from a lower end of the second side surface S2' parallel to the first upper surface US1.

The second step ST2-1 may be defined by the second upper surface US2' of the buffer layer BFL, a third side surface S3' of the buffer layer BFL, and a third upper surface US3' of the buffer layer BFL.

The third side surface S3' may extend downward from an end of the second upper surface US2' and may be disposed outward of the second side surface S2'. The third side surface S3' may form an obtuse angle with the second upper surface US2'. The third upper surface US3' may extend outward from a lower end of the third side surface S3' parallel to the second upper surface US2'.

The third step ST3-1 may be defined by the third upper surface US3' of the buffer layer BFL, a fourth side surface S4' of the buffer layer BFL, and a fourth upper surface US4' of the buffer layer BFL.

The fourth side surface S4' may extend downward from an end of the third upper surface US3' and may be disposed outward of the third side surface S3'. The fourth side surface S4' may form an obtuse angle with the third upper surface US3'. The fourth upper surface US4' may extend outward from a lower end of the fourth side surface S4' parallel to the third upper surface US3'. The fourth upper surface US4' may be disposed in a lower position than the upper surface of the first pad electrode PD1.

FIGS. 23 to 31 are views for explaining a method of manufacturing the display device according to an embodiment.

FIGS. 23 to 31 may correspond to FIGS. 10 to 18.

The following description will be focused on the difference between the manufacturing method illustrated in FIGS. 10 to 18 and the manufacturing method illustrated in FIGS. 23 to 31.

Figure 23:
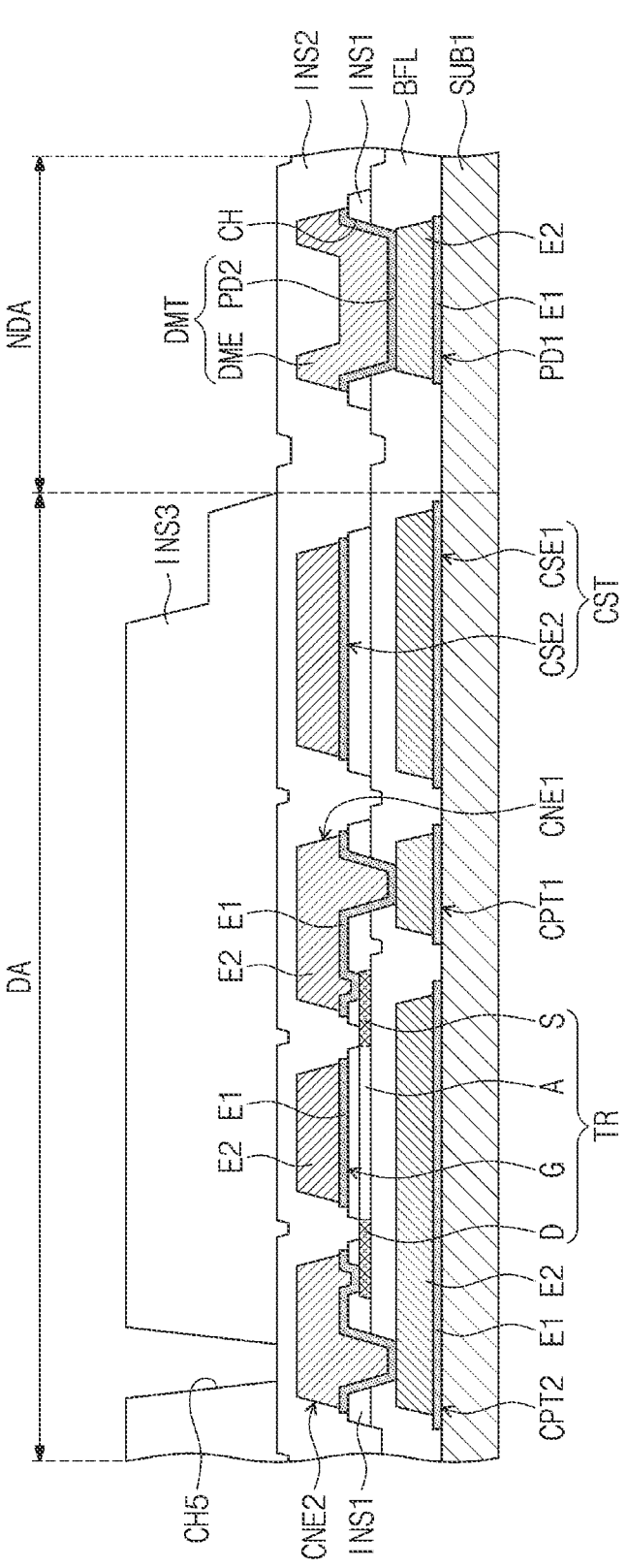

Referring to FIG. 23, in the non-display area NDA, the second insulating layer INS2 may be provided on the dummy metal DMT. The third insulating layer INS3 may be disposed on the second insulating layer INS2 in the display area DA.

Figure 24:
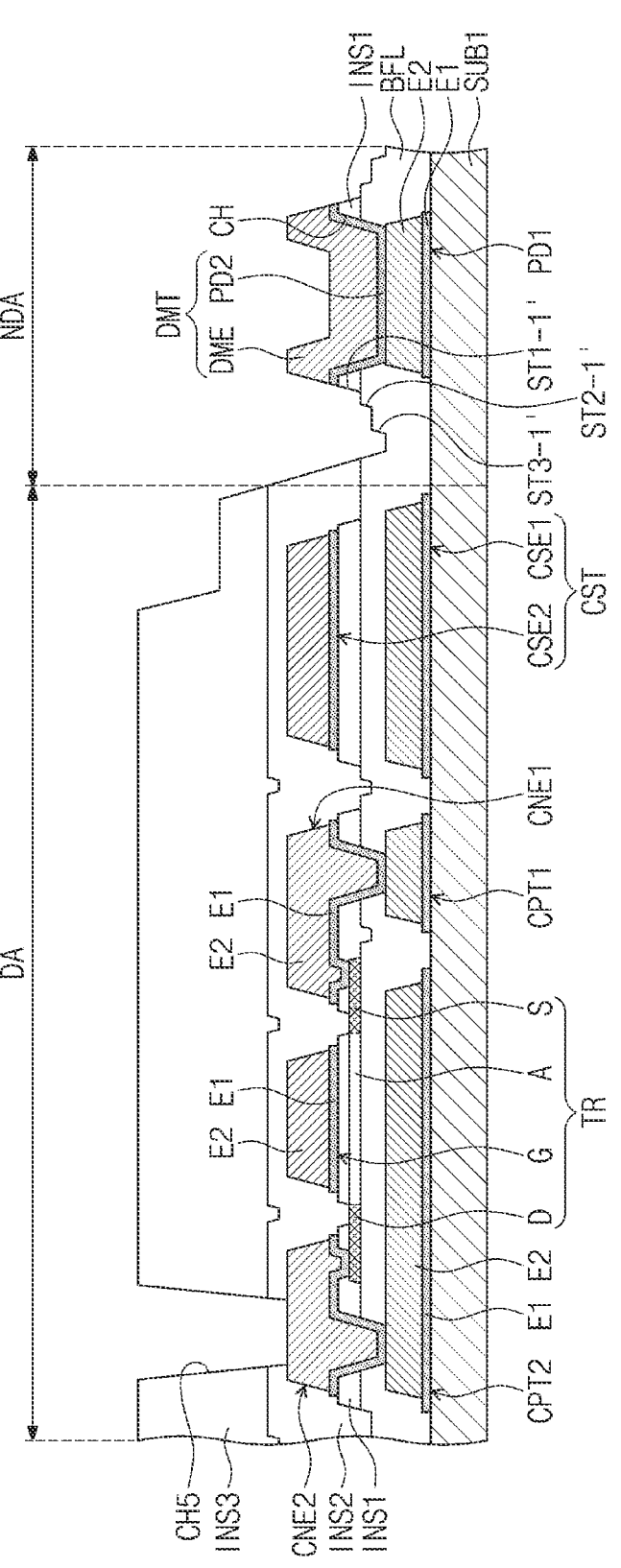

Referring to FIG. 24, the portion of the second insulating layer INS2 disposed over the non-display area NDA may be removed by dry etching, with the third insulating layer INS3 as a mask. In case that the second insulating layer INS2 is removed, a portion of the first insulating layer INS1 may be removed.

Figure 25:
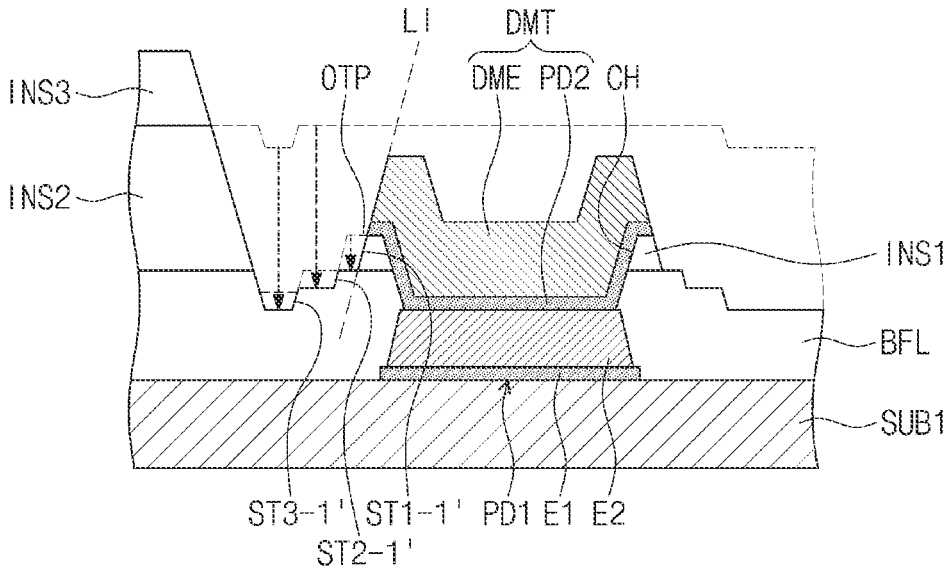

FIG. 25 is an enlarged view of the first pad and the dummy metal illustrated in FIG. 24.

Referring to FIGS. 24 and 25, all of the outer portion OTP may be removed in case that the second insulating layer INS2 is removed. The outer portion OTP may be defined as a portion disposed outward of an inclined dotted line L1 extending from an inclined surface at an end of the second pad electrode PD2. The outer portion OTP may be removed from the upper surface to the lower surface thereof, and thus the entire outer portion OTP may be removed.

The dry etching may be performed until the outer portion OTP is entirely removed. In case that the second insulating layer INS2 is removed, a portion of the buffer layer BFL around the outer portion OTP may be further etched. Accordingly, a first step ST1-1' may be defined on the first insulating layer INS1, and a second step ST2-1' may be defined on the buffer layer BFL around the outer portion OTP.

A step formed on the buffer layer BFL depending on the thickness of the first pad electrode PD1 may be more deeply etched to form a third step ST3-1'. The third step ST3-1' may be formed below the second step ST2-1'. Accordingly, the first step ST1-1', the second step ST2-1', and the third step ST3-1' may be continuously formed in a downward direction.

Figure 26:
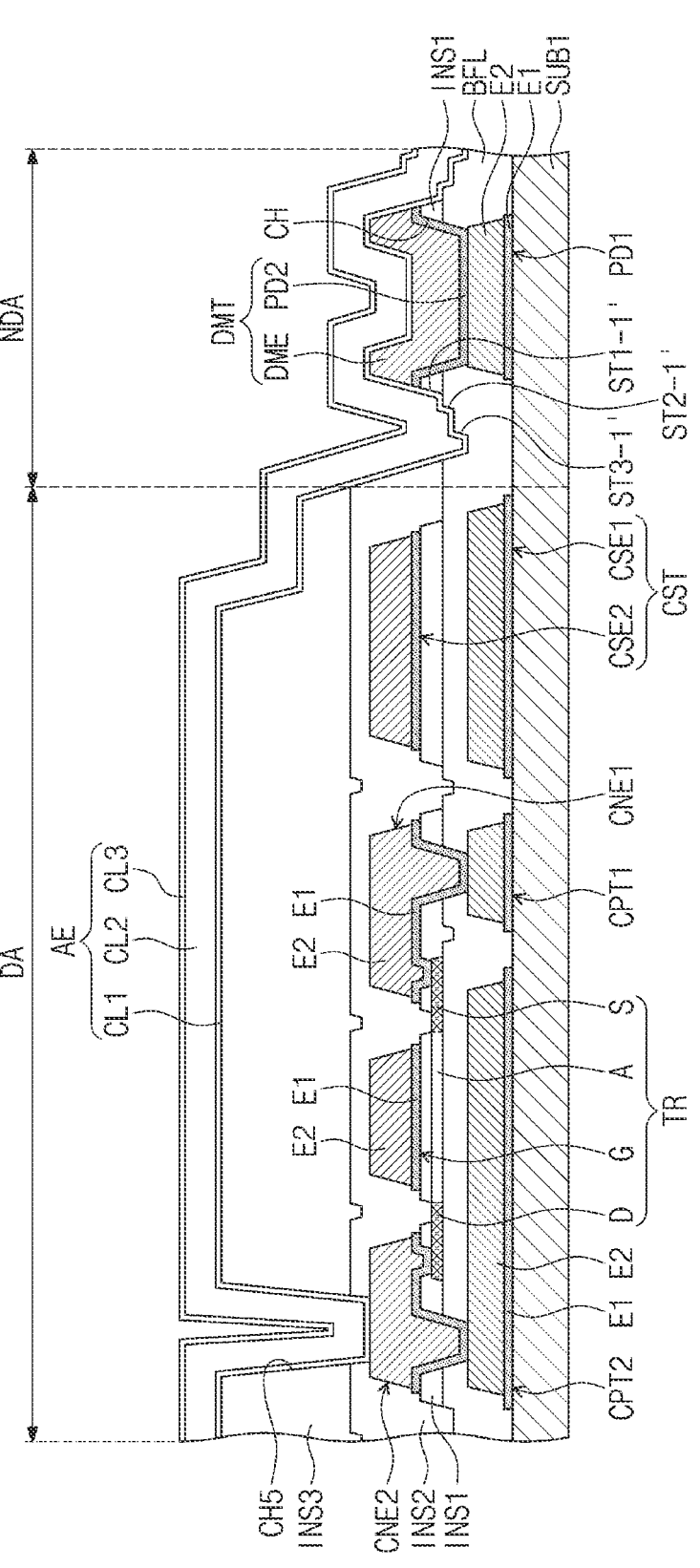

Referring to FIG. 26, the anode may be disposed on the third insulating layer INS3, the buffer layer BFL, the first insulating layer INS1, and the dummy metal DMT.

Figure 27:
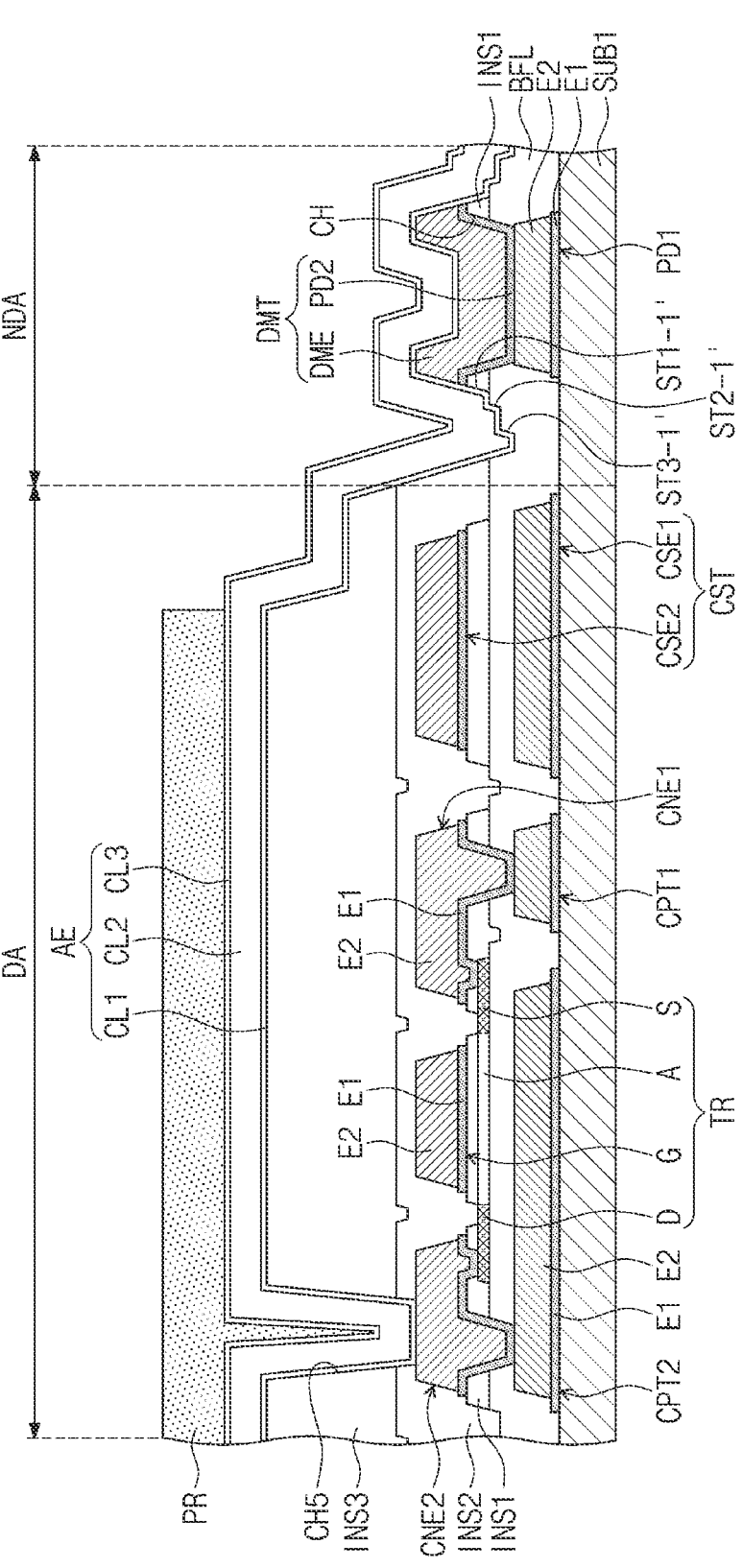

Referring to FIG. 27, in the display area DA, photoresist PR may be spaced apart from the step portion of the third insulating layer INS3 and may be provided on the third insulating layer INS3.

Figure 28:
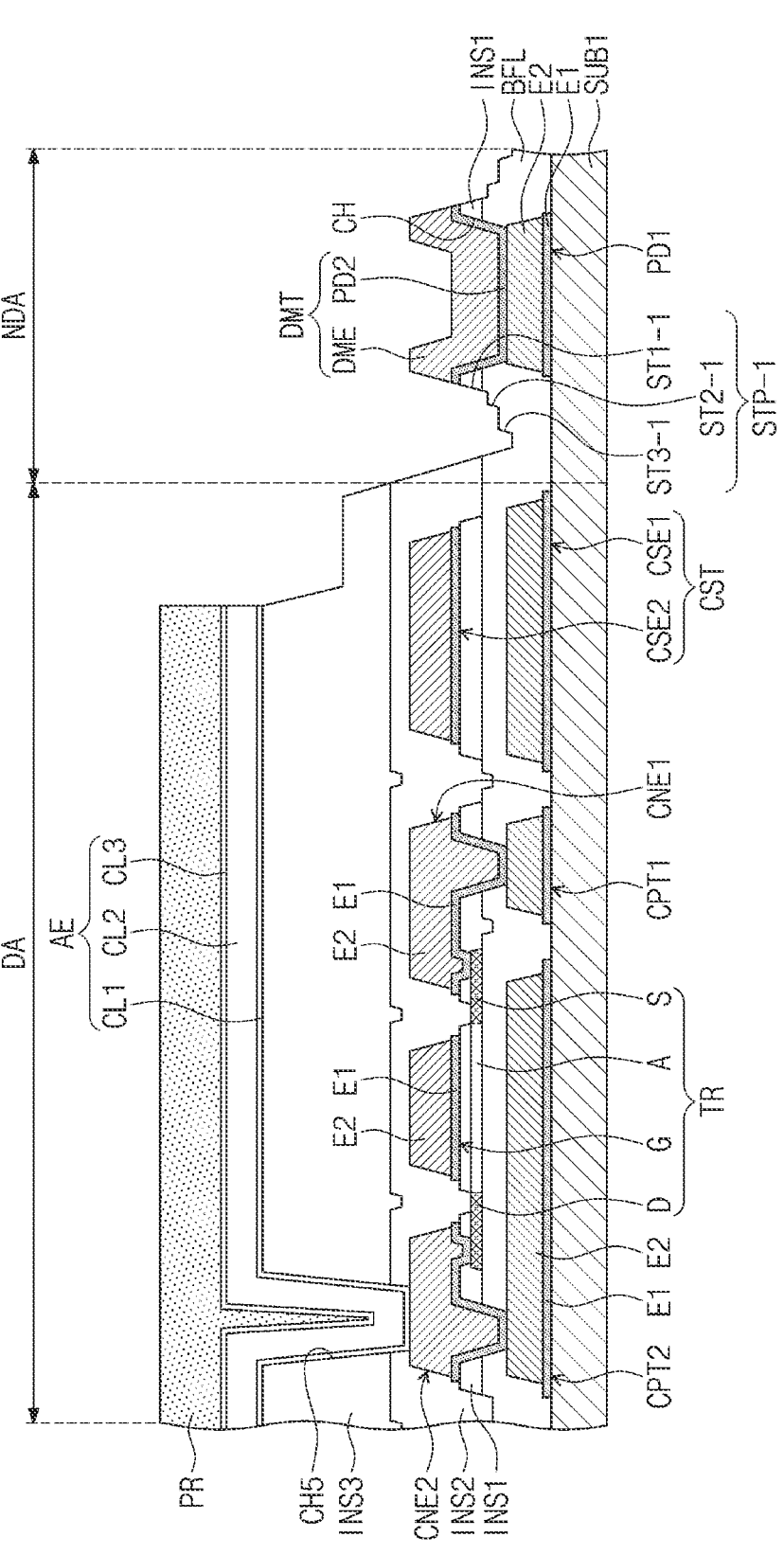

Referring to FIG. 28, the portion of the anode AE exposed by the photoresist PR may be removed by wet etching, with the photoresist PR as a mask. Thereafter, an ashing process may be performed on the non-display area NDA.

In case that the ashing process is performed, the first, second, and third steps ST1-1', ST2-1', and ST3-1' illustrated in FIG. 25 may be more deeply etched. As a result, the first, second, and third steps ST1-1, ST2-1, and ST3-1 according to an embodiment, which are illustrated in FIG. 28, may be formed.

Figure 29:
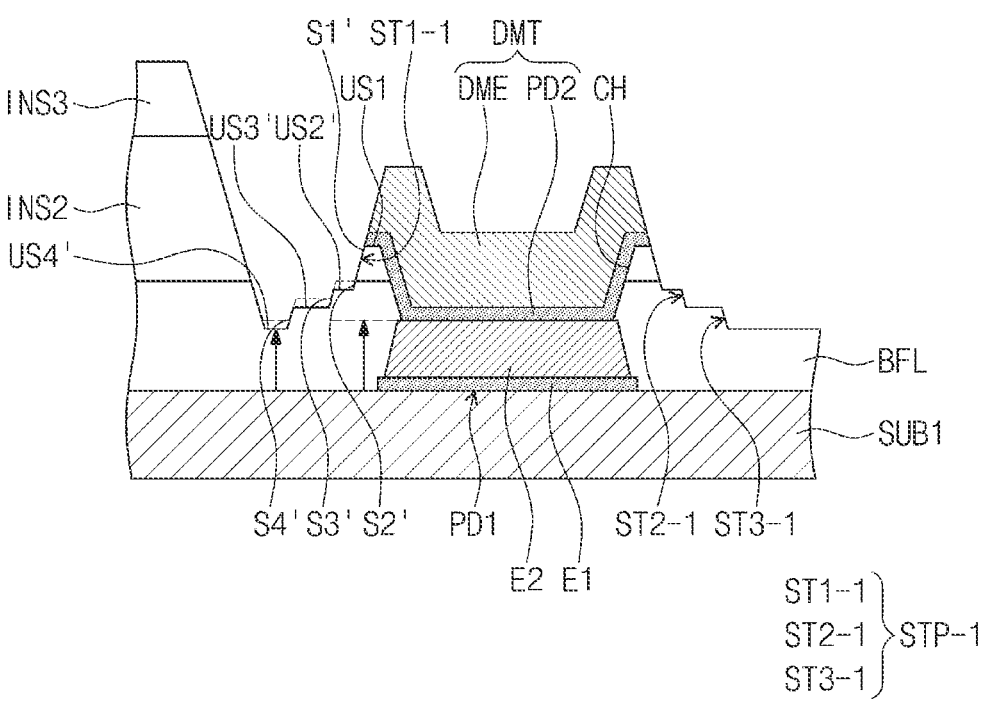

FIG. 29 is an enlarged view of the first, second, and third steps illustrated in FIG. 28.

Referring to FIG. 29, the buffer layer BFL around the first insulating layer INS1 may be further etched by the ashing process. Accordingly, the first step ST1-1 may be continuously defined on the first insulating layer INS1 and the buffer layer BFL, and the second step ST2-1 and the third step ST3-1 may be defined on the buffer layer BFL. According to this process, the fourth upper surface US4' of the buffer layer BFL may be located (or disposed) in a lower position than the upper surface of the first pad electrode PD1.

Figure 30:
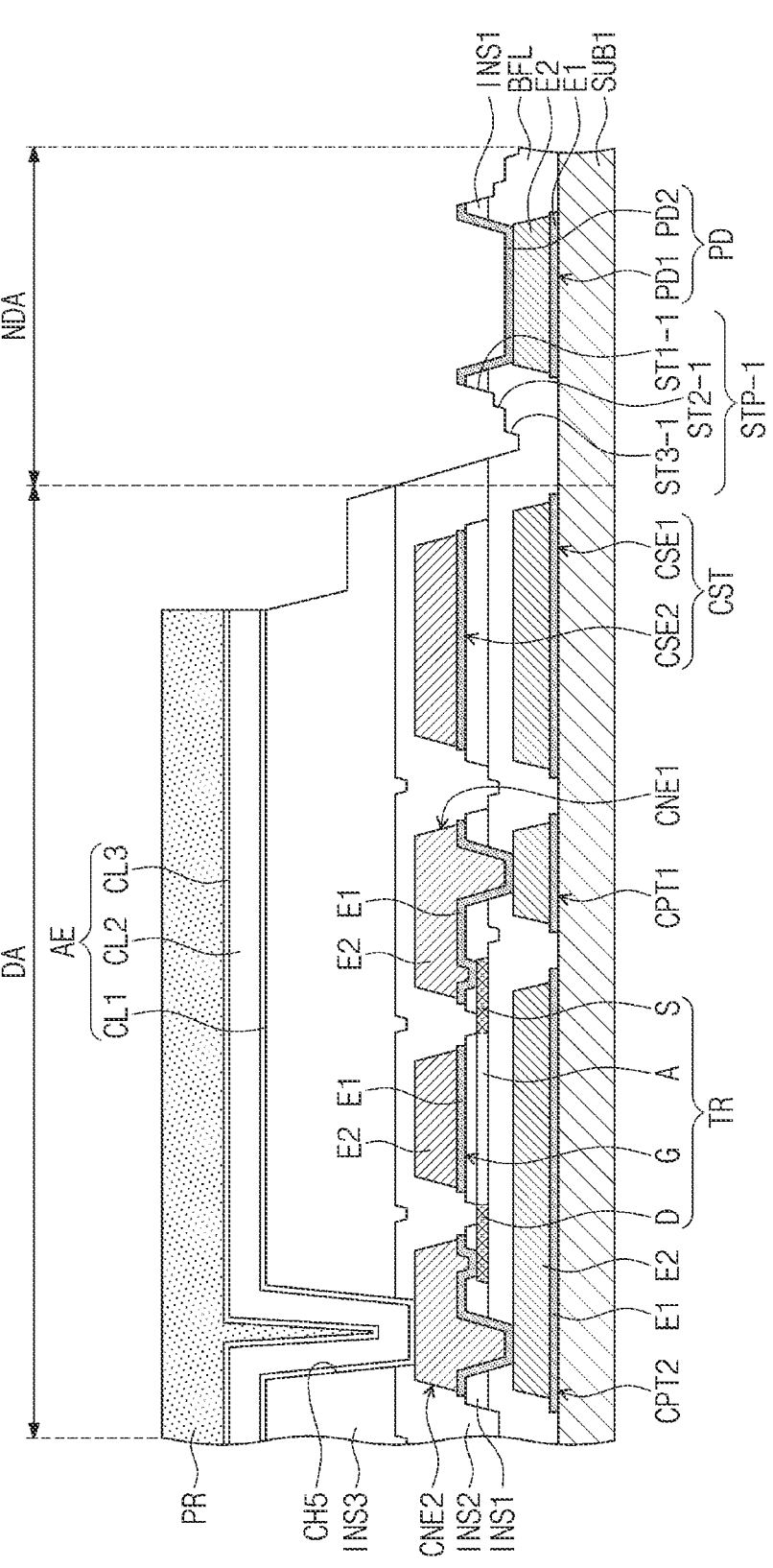

Referring to FIG. 30, the dummy electrode DME on the second pad electrode PD2 may be removed.

Figure 31:
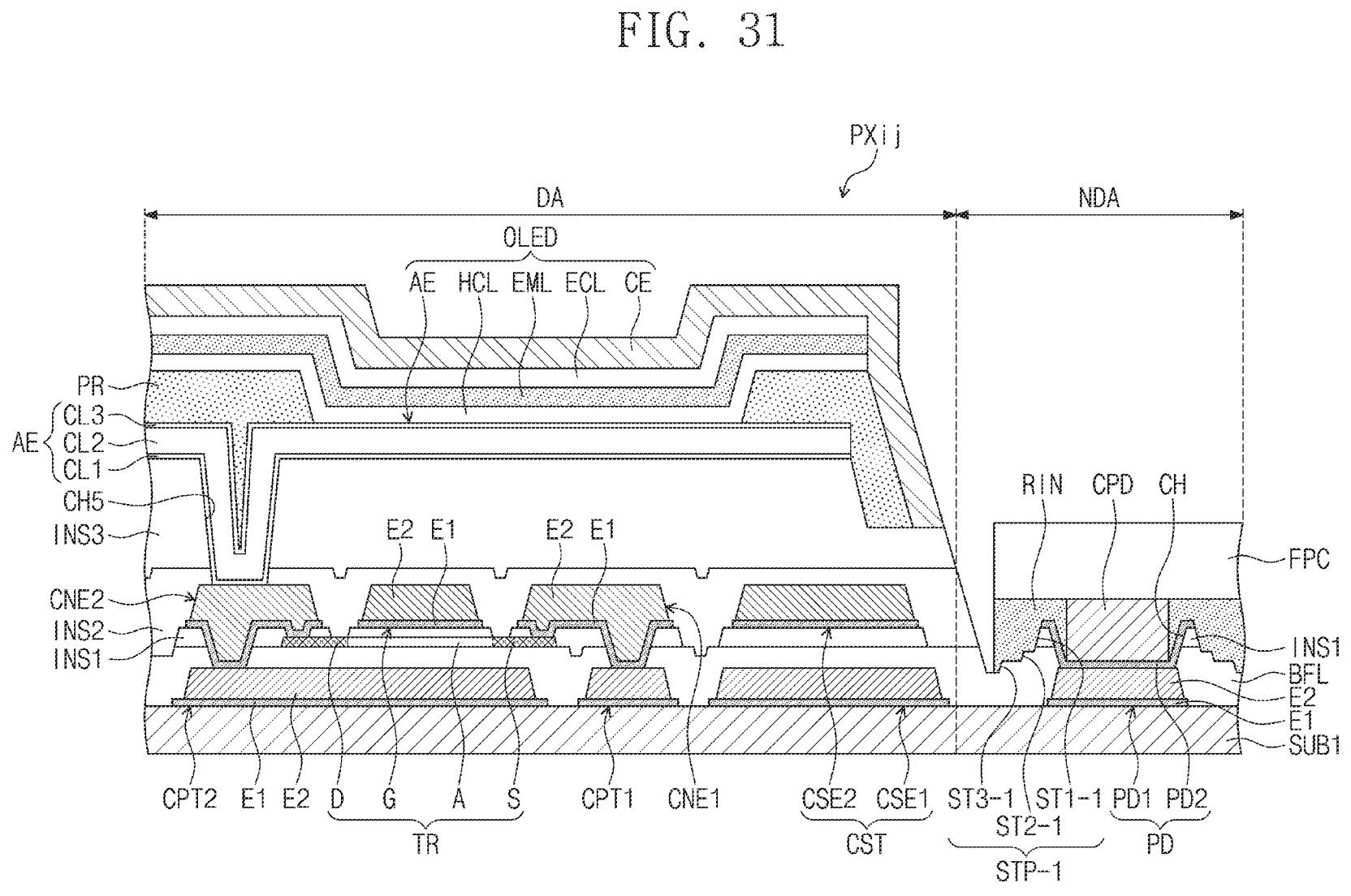

Referring to FIG. 31, the light emitting element OLED may be formed over the display area DA. The connecting pad CPD may be brought into contact with and electrically connected to the pad PD by a bonding process. The resin RIN may be disposed around the second pad electrode PD2 and the connecting pad CPD brought into contact with each other.

According to the embodiments, the pad may be formed by using the first pad electrode having the double stacked structure and the dummy metal having the double stacked structure. Accordingly, the configuration of the pad may be simplified, and deposition processes and etching processes for forming the pad may be decreased.

All of the second pad electrode may be exposed upward, and the exposed second pad electrode may have a greater width than the first pad electrode. Accordingly, in case that the pad is connected to the connecting pad, contact of the pad with the connecting pad may be improved, and thus a bonding process may be more readily performed. The triple step may be defined on the buffer layer and the first insulating layer that are around the pad, and thus the resin around the pad may be more firmly attached to the triple step.

While the disclosure has been described with reference to embodiments thereof, it will be apparent to those of ordinary skill in the art that various changes and modifications may be made thereto without departing from the spirit and scope of the disclosure and as set forth in the following claims.

What is claimed is:

1. A display device comprising:
a pixel;
a first pad electrode disposed around the pixel;
a buffer layer disposed on the first pad electrode;
a first insulating layer disposed on the buffer layer; and
a second pad electrode disposed on the first insulating layer, the second pad electrode being electrically connected to the first pad electrode through a contact hole in the first insulating layer and the buffer layer,
wherein a first step, a second step below the first step, and a third step below the second step include surfaces of the first insulating layer and the buffer layer around the first pad electrode and the second pad electrode, the surfaces of the first insulating layer and the buffer layer including a surface of the first insulating layer connected to a surface of the buffer layer.

2. The display device of claim 1, wherein
the first step includes one or more surfaces of the first insulating layer,
the second step includes continuously connected surfaces of the buffer layer and the first insulating layer, and
the third step includes one or more surfaces of the buffer layer.

3. The display device of claim 2, wherein
the second step is disposed outward of the first step, and
the third step is disposed outward of the second step.

4. The display device of claim 2, wherein
the first step is defined by a first upper surface of the first insulating layer that contacts the second pad electrode, a first side surface of the first insulating layer that extends downward from an end of the first upper surface that overlaps an end of the second pad electrode in a plan view, and a second upper surface of the first insulating layer that extends outward from a lower end of the first side surface parallel to the first upper surface, the second step is defined by the second upper surface, a second side surface of the first insulating layer that extends downward from an end of the second upper surface and disposed outward of the first side surface, a third side surface of the buffer layer disposed below the second side surface and formed to be a same side surface as the second side surface, and a third upper surface of the buffer layer that extends outward from a lower end of the third side surface parallel to the second upper surface, and the third step is defined by the third upper surface, a fourth side surface of the buffer layer that extends downward from an end of the third upper surface and disposed outward of the third side surface, and a fourth upper surface of the buffer layer that extends outward from a lower end of the fourth side surface parallel to the third upper surface.

5. The display device of claim 4, wherein a lower surface of the first insulating layer below the first upper surface and a lower surface of the first insulating layer below the second upper surface are coplanar, and the third step is further defined by a thickness of the first pad electrode.

6. The display device of claim 1, wherein the pixel includes:
    a transistor including a gate electrode, a source electrode, and a drain electrode;
    a light emitting element disposed over the transistor and electrically connected to the drain electrode;
    a first conductive pattern and a second conductive pattern disposed below the transistor;
    a first connecting electrode electrically connected to the first conductive pattern and the source electrode; and
    a second connecting electrode electrically connected to the second conductive pattern, the drain electrode, and the light emitting element, the first connecting electrode, the second connecting electrode, and the gate electrode are disposed on a same layer, the first pad electrode, the first conductive pattern, and the second conductive pattern are disposed on a same layer, and the second pad electrode and a portion of the gate electrode are disposed on a same layer.

7. The display device of claim 6, wherein the gate electrode, the first conductive pattern, the second conductive pattern, and the first pad electrode each include:
    a first electrode; and
    a second electrode disposed on the first electrode, the second pad electrode and the first electrode of the gate electrode are disposed on a same layer, and the second pad electrode and the first electrode of the gate electrode contain a same material.

8. The display device of claim 1, wherein the second pad electrode and the first pad electrode extend in a second direction intersecting a direction, and the second pad electrode has a greater width than a width of the first pad electrode in the direction.

9. The display device of claim 1, wherein the first step includes continuously connected surfaces of the first insulating layer and the buffer layer, and the second step and the third step each include one or more surfaces of the buffer layer.

10. The display device of claim 9, wherein the first step is defined by a first upper surface of the first insulating layer that contacts the second pad electrode, a first side surface of the first insulating layer that extends downward from an end of the first upper surface that overlaps an end of the second pad electrode in a plan view, a second side surface of the buffer layer disposed below the first side surface and disposed on a same side surface as the first side surface of the first insulating layer, and a second upper surface of the buffer layer that extends outward from a lower end of the second side surface parallel to the first upper surface, the second step is defined by the second upper surface, a third side surface of the buffer layer that extends downward from an end of the second upper surface and disposed outward of the second side surface, and a third upper surface of the buffer layer that extends outward from a lower end of the third side surface parallel to the second upper surface, and the third step is defined by the third upper surface, a fourth side surface of the buffer layer that extends downward from an end of the third upper surface and disposed outward of the third side surface, and a fourth upper surface of the buffer layer that extends outward from a lower end of the fourth side surface parallel to the third upper surface.

11. The display device of claim 10, wherein the fourth upper surface is disposed lower than an upper surface of the first pad electrode.

12. A method for manufacturing a display device, the method comprising:

providing a first pad electrode on a non-display area of a substrate, the substrate including a display area and the non-display area adjacent to the display area;

providing a buffer layer and a first insulating layer on the first pad electrode in sequence;

providing a dummy metal on the first insulating layer, the dummy metal being electrically connected to the first pad electrode through a contact hole in the first insulating layer and the buffer layer;

providing a second insulating layer on the buffer layer to cover the dummy metal;

removing a portion of the second insulating layer that overlaps the non-display area in a plan view;

providing an anode over the display area; and removing a dummy electrode of the dummy metal disposed on a second pad electrode of the dummy metal, wherein a first step, a second step, and a third step include surfaces of the first insulating layer and the buffer layer around the first pad electrode and the second pad electrode, the surfaces of the first insulating layer and the buffer layer including a surface of the first insulating layer connected to a surface of the buffer layer.

13. The method of claim 12, wherein the first step includes one or more surfaces of the first insulating layer, the second step includes continuously connected surfaces of the first insulating layer and the buffer layer, the third step includes one or more surfaces of the buffer layer, and the first step and the second step are formed in the removing of the portion of the second insulating layer.

14. The method of claim 13, wherein a portion of the first insulating layer disposed around the dummy metal is defined as an outer portion, and in case that the portion of the second insulating layer is removed, the outer portion is removed from an upper surface of the outer portion to a portion between the upper surface of the outer portion and a lower surface of the outer portion.

15. The method of claim 12, further comprising:

providing a third insulating layer on the second insulating layer in the display area; and providing the anode on the third insulating layer.

16. The method of claim 15, wherein the providing of the anode includes:

providing the anode on the third insulating layer and the dummy metal in the display area and the non-display area;

removing a portion of the anode disposed on the non-display area; and performing ashing on the non-display area.

17. The method of claim 16, wherein the first step includes continuously connected surfaces of the first insulating layer and the buffer layer, the second step and the third step each include one or more surfaces of the buffer layer, and the first step and the second step are formed in the performing of the ashing on the non-display area.

18. The method of claim 16, wherein a portion of the first insulating layer disposed around the dummy metal is defined as an outer portion, and in case that the portion of the second insulating layer is removed, the outer portion is removed.

19. The method of claim 12, wherein the second pad electrode and the first pad electrode extend in a direction, and the second pad electrode has a greater width than a width of the first pad electrode in another direction intersecting the direction.

20. A method for manufacturing a display device, the method comprising:

providing a first pad electrode on a non-display area of a substrate, the substrate including a display area and the non-display area adjacent to the display area;

providing a buffer layer and a first insulating layer on the first pad electrode in sequence;

providing a dummy metal on the first insulating layer, the dummy metal being electrically connected to the first pad electrode through a contact hole in the first insulating layer and the buffer layer;

providing a second insulating layer over the substrate to cover the dummy metal;

removing a portion of the second insulating layer that overlaps the non-display area in a plan view;

defining a portion of the first insulating layer disposed around the dummy metal as an outer portion and removing the outer portion from an upper surface of the outer portion to a portion between the upper surface and a lower surface of the outer portion in case that the portion of the second insulating layer is removed; and removing a dummy electrode of the dummy metal disposed on a second pad electrode of the dummy metal, wherein in the removing of the portion of the second insulating layer, a first step and a second step are formed on a periphery of the first insulating layer around the second pad electrode, such that the first step and the second step include surfaces of the first insulating layer and the buffer layer around the first pad electrode and the second pad electrode, the surfaces of the first insulating layer and the buffer layer including a surface of the first insulating layer connected to a surface of the buffer layer.

21. An electronic device, comprising:

a display device configured to provide an image, wherein the display device includes a pixel, a first pad electrode disposed around the pixel, a buffer layer disposed on the first pad electrode, a first insulating layer disposed on the buffer layer, and a second pad electrode disposed on the first insulating layer, the second pad electrode being electrically connected to the first pad electrode through a contact hole in the first insulating layer and the buffer layer, wherein a first step, a second step below the first step, and a third step below the second step include surfaces of the first insulating layer and the buffer layer around the first pad electrode and the second pad electrode, the surfaces of the first insulating layer and the buffer layer including a surface of the first insulating layer connected to a surface of the buffer layer.

* * * * *